(12) United States Patent
Ogawa

(10) Patent No.: US 8,542,051 B2
(45) Date of Patent: Sep. 24, 2013

(54) LEVEL SHIFT CIRCUIT AND SEMICONDUCTOR DEVICE

(75) Inventor: Yasushige Ogawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/218,154

(22) Filed: Aug. 25, 2011

(65) Prior Publication Data

US 2012/0133416 A1    May 31, 2012

(30) Foreign Application Priority Data

Nov. 30, 2010    (JP) ................................. 2010-266925

(51) Int. Cl.
*H03L 5/00*    (2006.01)
(52) U.S. Cl.
USPC ............................... 327/333; 326/62; 326/81
(58) Field of Classification Search
USPC .................. 326/62–63, 80–82; 327/306, 333
See application file for complete search history.

(56) References Cited

U.S. PATENT DOCUMENTS

| 6,535,046 B2* | 3/2003 | Kaiser et al. .................. 327/333 |
| 6,850,108 B2* | 2/2005 | Shin .............................. 327/319 |
| 2005/0195012 A1 | 9/2005 | Sueoka et al. |

FOREIGN PATENT DOCUMENTS

| JP | 5-283997 A | 10/1993 |
| JP | 6-204850 A | 7/1994 |
| JP | 2005-252481 A | 9/2005 |

* cited by examiner

*Primary Examiner* — Dinh T. Le
(74) *Attorney, Agent, or Firm* — Arent Fox LLP

(57) ABSTRACT

A level shift circuit including a level conversion unit that converts an input signal having a signal level of a first voltage into a signal having a signal level of a second voltage that is higher than the first voltage. The level conversion unit includes first and second MOS transistors of a first conductivity type and third and fourth MOS transistors of a second conductivity type, which differs from the first conductivity type and of which switching is controlled in accordance with the input signal. The third and fourth MOS transistors include drains supplied with the second voltage via the first and second MOS transistors, respectively. A control unit, when detecting a decrease in the first voltage, controls a body bias of the third and fourth MOS transistors to decrease a threshold voltage of the third and fourth MOS transistors.

16 Claims, 13 Drawing Sheets

| FA | FB | NMOS function |
|---|---|---|
| H | H | NG |
| H | L | NG |
| L | H | OK (substrate bias is appropriate) |
| L | L | high substrate bias required |

| Count Signal Q | | | Selection Signal SS |
|---|---|---|---|
| Q2 | Q1 | Q0 | |
| 1 | 1 | 1 | SW7 |
| 1 | 1 | 0 | SW6 |
| 1 | 0 | 1 | SW5 |
| 1 | 0 | 0 | SW4 |
| 0 | 1 | 1 | SW3 |
| 0 | 1 | 0 | SW2 |
| 0 | 0 | 1 | SW1 |
| 0 | 0 | 0 | SW0 |

Fig.11

| VH/VL [V] \ VL[V] DVR \ DVL | | 1 000 | 1.5 001 | 2 010 | 2.5 011 | 3 100 | 3.5 101 | ④ 110 | 4.5 111 | | Vbb | ES |
|---|---|---|---|---|---|---|---|---|---|---|---|---|
| 0.2 | 000 | 0.2 | 0.3 | 0.4 | 0.5 | 0.6 | 0.7 | 0.8 | 0.9 | | 0 | 000 |
| 0.3 | 001 | 0.1 | 0.2 | 0.3 | 0.4 | 0.5 | 0.6 | 0.7 | 0.8 | | 0.1 | 001 |
| 0.4 | 010 | 0 | 0 | 0.1 | 0.2 | 0.3 | 0.4 | 0.5 | 0.6 | | 0.2 | 010 |
| ⓪.5 | ⓪11 | 0 | 0 | 0 | 0.1 | 0.2 | 0.3 | ⓪.4 | 0.5 | | 0.3 | 011 |
| 0.6 | 100 | 0 | 0 | 0 | 0.1 | 0.2 | 0.2 | 0.3 | 0.4 | | ⓪.4 | ⓪00 |
| 0.7 | 101 | 0 | 0 | 0 | 0 | 0.1 | 0.2 | 0.2 | 0.3 | | 0.5 | 101 |
| 0.8 | 110 | 0 | 0 | 0 | 0 | 0 | 0.1 | 0.1 | 0.2 | | 0.6 | 110 |
| 0.9 | 111 | 0 | 0 | 0 | 0 | 0 | 0 | 0.1 | 0.1 | | 0.7 | 111 |

86a

| VH/VL [V] | | 1 | 1.5 | 2 | 2.5 | 3 | 3.5 | 4 | 4.5 | | | |
|---|---|---|---|---|---|---|---|---|---|---|---|---|
| VL [V] | DVR DVL | 000 | 001 | 010 | 011 | 100 | 101 | 110 | 111 | | Vbb | ES |
| 0.2 | 000 | 0.2 | NG | NG | NG | NG | NG | NG | NG | | 0 | 000 |
| 0.3 | 001 | 0.1 | 0.2 | 0.3 | NG | NG | NG | NG | NG | | 0.1 | 001 |
| 0.4 | 010 | 0 | 0 | 0.1 | 0.2 | 0.3 | 0.4 | NG | NG | | 0.2 | 010 |
| 0.5 | 011 | 0 | 0 | 0 | 0.1 | 0.2 | 0.3 | 0.4 | 0.5 | | 0.3 | 011 |
| 0.6 | 100 | 0 | 0 | 0 | 0.1 | 0.2 | 0.2 | 0.3 | 0.4 | | 0.4 | 100 |
| 0.7 | 101 | 0 | 0 | 0 | 0 | 0.1 | 0.2 | 0.2 | 0.3 | | 0.5 | 101 |
| 0.8 | 110 | 0 | 0 | 0 | 0 | 0 | 0.1 | 0.1 | 0.2 | | NG | 111 |
| 0.9 | 111 | 0 | 0 | 0 | 0 | 0 | 0 | 0.1 | 0.1 | | | |

106a

US 8,542,051 B2

LEVEL SHIFT CIRCUIT AND SEMICONDUCTOR DEVICE

CROSS-REFERENCE TO RELATED APPLICATIONS

This application is based upon and claims the benefit of priority from prior Japanese Patent Application No. 2010-225544, filed on Oct. 5, 2010, the entire contents of which are incorporated herein by reference.

FIELD

The present invention relates to a level shift circuit and a semiconductor device.

BACKGROUND

A multiple power supply semiconductor large scale integration (LSI) includes a level shift circuit, which interconnects circuits having different power supply voltages (refer to, for example, Japanese Laid-Open Patent Publication Nos. 2005-252481, 05-283997, and 06-204850).

FIG. 17 illustrates one example of a conventional level shift circuit 120.

The level shift circuit 120 outputs an output signal So, which corresponds to an input signal Si. The gate of an N-channel MOS transistor TN11 is provided via an inverter circuit 121 with the input signal Si, which has the signal levels of a reference voltage GND and a first high potential voltage VL. The gate of an N-channel MOS transistor TN12 is provided with the input signal Si via the inverter circuit 121 and a further inverter circuit 122. Accordingly, the gates of the transistors TN11 and TN12 are provided with signals that are inverted from each other.

The drains of the transistors TN11 and TN12 are coupled to the drains of P-channel MOS transistors TP11 and TP12, respectively. The sources of the transistors TP11 and TP12 are supplied with a second high potential voltage VH, which is higher than the first high potential voltage VL. Further, the gate of the transistor TP11 is coupled to the drain of the transistor TP12, and the gate of the transistor TP12 is coupled to the drain of the transistor TP11. This forms a so-called cross-coupled connection (cross-connection). The output signal So is output via an inverter circuit 123 from a node N100 between the transistors TP11 and TP12.

In the level shift circuit 120, in response to an input signal Si having an H-level (first high potential voltage level VL), the transistor TN11 is inactivated and the transistor TN12 is activated. Subsequently, the transistor TP11 is activated and the transistor TP12 is inactivated. This outputs an output signal So having an H level (second high potential voltage level VH) from the inverter circuit 123.

When an input signal Si having an L level (reference voltage level GND) is input, the transistor TN11 is activated and the transistor TN12 is inactivated. Subsequently, the transistor TP11 is inactivated and the transistor TP12 is activated. This outputs an output signal So having an L level (reference voltage level GND) from the inverter circuit 123.

In this manner, the level shift circuit 120 converts the input signal Si, which has the signal levels of the reference voltage GND and the first high potential voltage VL, into the output signal So, which has signal levels of the reference voltage GND and the second high potential voltage VH.

The drains of the N-channel MOS transistors TN11 and TN12 are supplied with the second high potential voltage VH via the activated P-channel MOS transistors TP11 and TP12. Thus, a high withstand voltage corresponding to the second high potential voltage VH is set for the N-channel MOS transistors TN11 and TN12. The high-withstand voltage transistors TN11 and TN12 have a high threshold voltage. There is a recent trend of a decrease in the power supply voltage of semiconductor integrated circuits. Thus, the supply of the first high potential voltage VL to the transistors TN11 and TN12, which have high threshold voltages, may result in problems that arise as will now be described. When the first high potential voltage VL is close to the threshold voltage of the transistors TN11 and TN12, the first high potential voltage VL may not be able to activate the transistor TN12. In such a case, the transistor TN12 cannot generate a flow of current that is sufficient for lowering the voltage at node N100 to the reference voltage level GND. As a result, the level shift circuit 120 may fail to function properly.

SUMMARY

One aspect of the present invention is a level shift circuit including a level conversion unit that converts an input signal having a signal level of a first voltage into a signal having a signal level of a second voltage that is higher than the first voltage. The level conversion unit includes first and second MOS transistors of a first conductivity type and third and fourth MOS transistors of a second conductivity type, which differs from the first conductivity type and of which switching is controlled in accordance with the input signal. The third and fourth MOS transistors include drains supplied with the second voltage via the first and second MOS transistors, respectively. A control unit is coupled to the level conversion unit. The control unit, when detecting a decrease in the first voltage, controls a body bias of the third and fourth MOS transistors to decrease a threshold voltage of the third and fourth MOS transistors.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which:

FIG. 11 is a conversion table according to the third embodiment;

DESCRIPTION OF EMBODIMENTS

Figure 1:
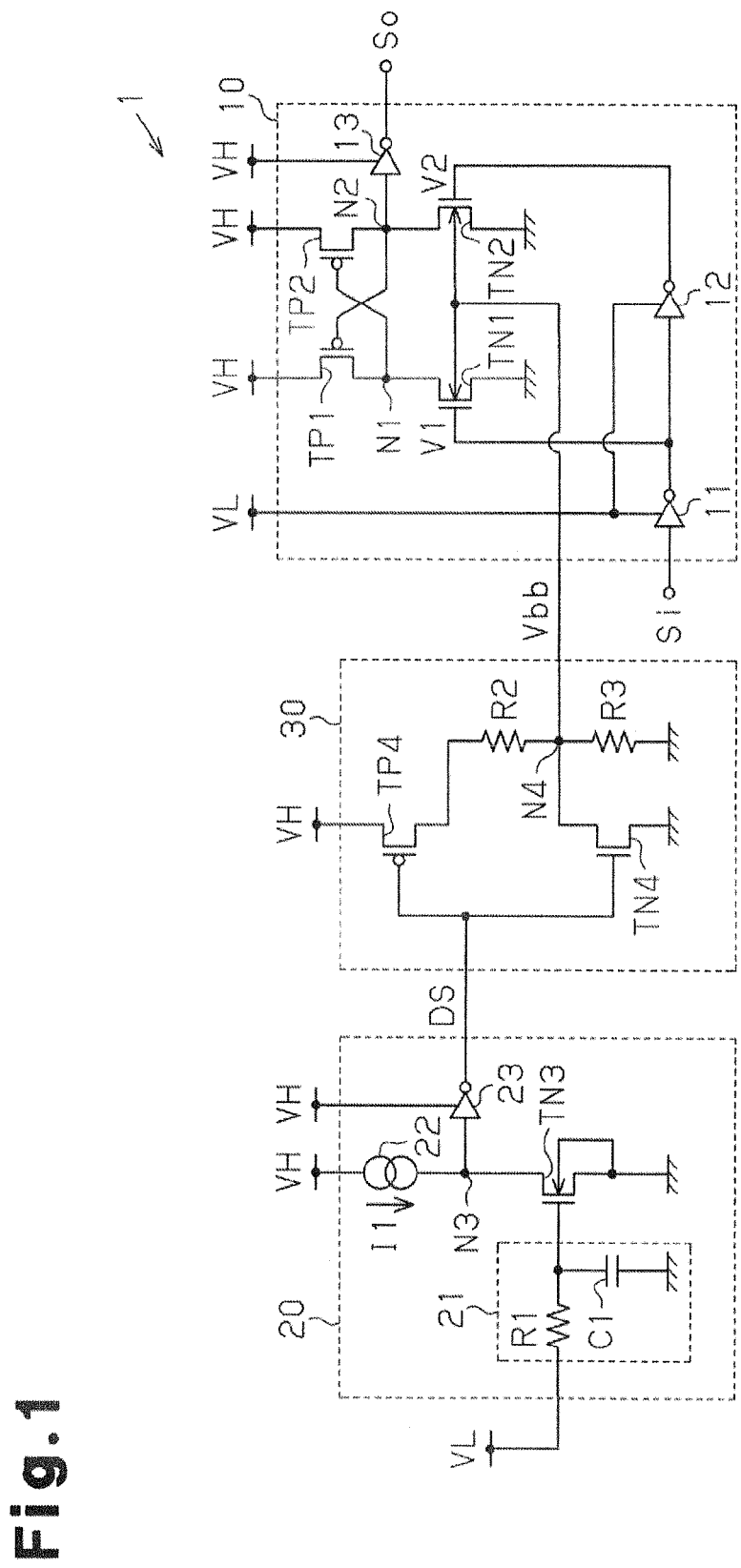
FIG. 1 is a circuit diagram of a level shift circuit according to a first embodiment.

A first embodiment will now be described with reference to FIGS. 1 to 3.

A level shift circuit 1 converts an input signal Si, which has the signal levels of a reference voltage (low potential voltage) and a first high potential voltage VL, into an output signal So, which has the signals levels of a reference voltage GND and a second high potential voltage VH that is higher than the first high potential voltage VL. Hereinafter, for the sake of brevity, the level of the first high potential voltage VL is referred to as the H1 level, the level of the second high potential voltage VH is referred to the H2 level, and the level of the reference voltage GND is referred to as the L level.

The level shift circuit 1 includes a level conversion unit 10, a detection unit 20, and a control unit 30. The level conversion unit 10 converts an H1 level input signal Si into an H2 level output signal So. The detection unit 20 detects a decrease in first high potential voltage VL. The control unit 30 controls a body bias Vbb of an MOS transistor in the level conversion unit 10 in accordance with the detection result of the detection unit 20.

The structure of the level conversion unit 10 will now be described.

An inverter circuit 11 receives the first high potential voltage VL as an operation voltage and the input signal Si, which has an amplification range between the L level and the H1 level. The inverter circuit 11 supplies an output voltage V1, which is obtained by reversing the logic of the input signal Si, to the gate of an N-channel MOS transistor TN1 and an inverter circuit 12. The inverter circuit 12 is supplied with the first high potential voltage VL as the operation voltage. The inverter circuit 12 supplies an output voltage V2, which is obtained by reversing the logic of the output signal V1, to the gate of an N-channel MOS transistor TN2. That is, the gate of the transistor TN1 is supplied with the output voltage V1, which is the inverted level of the input signal Si, while the gate of the transistor TN2 is supplied with the output voltage V2, which has the same level as the input signal Si. Thus, those transistors TN1 and TN2 are controlled so that they are activated and inactivated in a complementary manner according to the input signal Si.

The drain of the transistor TN1 is coupled to the drain of a P-channel MOS transistor TP1 and the gate of a P-channel MOS transistor TP2. The source of the transistor TN1 is coupled to ground. The drain of the transistor TN2 is coupled to the drain of the transistor TP2 and the gate of the transistor TP1. The source of the transistor TN2 is coupled to ground. In this manner, a node N1 between the transistors TN1 and TP1 is coupled to the gate of the transistor TP2, and a node N2 between the transistors TN2 and TP2 is coupled to the gate of the transistor TP1.

The sources of the transistors TP1 and TP2 are supplied with the second high potential voltage VH. Further, node N2 between the transistors TN2 and TP2 is coupled to an inverter circuit 13. The inverter circuit 13 is supplied with the second high potential voltage VH as the operation voltage. The inverter circuit 13 outputs the output signal So, which has an amplification range determined by the L level and the H2 level.

Further, the back gates of the transistors TN1 and TN2 are coupled to an output terminal of the control unit 30. The back gate voltage, that is, body bias Vbb of the transistors TN1 and TN2 is controlled by the detection unit 20 and the control unit 30. The body bias Vbb refers to a bias voltage applied to the back gates of the transistors TN1 and TN2, specifically, the bodies (substrates or wells, etc.) of the transistors TN1 and TN2.

Each of the transistors TN1, TN2, TP1, and TP2 is a high withstand voltage element of which the element withstand voltage is set in correspondence with the second high potential voltage VH. The P-channel MOS transistors TP1 and TP2 are examples of first and second MOS transistors of a first conductivity type, the N-channel MOS transistors TN1 and TN2 are examples of third and fourth MOS transistors of a second conductivity type, the first high potential voltage VL is an example of the first voltage, and the second high potential voltage VH is an example of the second voltage.

The structure of the detection unit 20 will now be described.

A first terminal of a resistor R1 is supplied with the first high potential voltage VL. A second terminal of the resistor R1 is coupled to a first terminal of a capacitor C1. A second terminal of the capacitor C1 is coupled to ground. A node between the resistor R1 and the capacitor C1 is coupled to the gate of an N-channel MOS transistor TN3. In this manner, the gate of the N-channel MOS transistor TN3 is supplied with the first high potential voltage VL via a low pass filter 21, which includes the resistor R1 and the capacitor C1. The low pass filter 21 functions as a protection circuit that protects the transistor TN3.

The N-channel MOS transistor TN3 has the same conductivity type and the same size as the N-channel MOS transistors TN1 and TN2 in the level conversion unit 10. The transistor TN3 is a high withstand voltage element like the transistors TN1 and TN2. A threshold voltage Vtha of the transistor TN3 (see FIG. 3) is set to be the same or higher than a threshold voltage Vth of the transistors TN1 and TN2 (refer to FIG. 3) when the back gates of the transistors TN1 and TN2 are coupled to the sources (ground in the illustrated example).

The transistor TN3 includes a source and back gate, which are coupled to ground, and a drain, which is coupled to a first terminal of a current source 22.

The current source 22 generates a flow of current I1. A second terminal of the current source 22 is supplied with the second high potential voltage VH. A node N3 between the current source 22 and the transistor TN3 is coupled to an input terminal of an inverter circuit 23. A current value of the current I1 is set in accordance with, for example, electrical characteristics (channel resistance) of the transistor TN3, a logical threshold value of the inverter circuit 23, or the like.

The inverter circuit 23 is supplied with the second high potential voltage VH as the operation voltage. An output terminal of the inverter circuit 23 is coupled to the input terminal of the control unit 30 so that a detection signal DS output from the inverter circuit 23 is provided to the control unit 30. Specifically, when the transistor TN3 is activated, the detection unit 20 outputs the H2 level detection signal DS from the inverter circuit 23. When the transistor TN3 is inactivated, the detection unit 20 outputs the L level detection signal DS from the inverter circuit 23.

The level conversion unit 10 is one example of a conversion circuit, the detection unit 20 is one example a detection circuit, the control unit 30 is one example of a voltage output circuit, and the transistor TN3 is one example of a fifth MOS transistor and a replica transistor. The replica transistors includes a transistor having the same characteristics as target transistors (here, transistors TN1 and TN2) and a transistor having a threshold value slightly higher than that of the target transistors.

Next, the structure of the control unit 30 will be described.

The detection signal DS of the detection unit 20 is provided to the gate of a P-channel MOS transistor TP4 and the gate of an N-channel MOS transistor TN4. The P-channel MOS transistor TP4 includes a source supplied with the second high potential voltage VH and a drain coupled to a first terminal of a resistor R2. A second terminal of the resistor R2 is coupled to a first terminal of a resistor R3, of which the second terminal is coupled to ground.

Further, the N-channel MOS transistor TN4 includes a source coupled to ground and a drain coupled to a node N4 between the resistors R2 and R3. Node N4 is coupled to the back gates of the transistors TN1 and TN2 in the level conversion unit 10. That is, a voltage at node N4 is the body bias Vbb of the TN1 and TN2.

For example, when the detection signal DS has the H2 level, in response to the detection signal DS, the transistor TP4 is inactivated and the transistor TN4 is activated. Thus, the body bias Vbb is set to the ground level. When the detection signal DS has the L level, in response to the detection signal DS, the transistor TP4 is activated and the transistor TN4 is inactivated. Thus, the body bias Vbb is set to a voltage level obtained by dividing the second high potential voltage with the resistors R2 and R3. That is, when the transistor TN3, which has the same electrical characteristics (element characteristics) as the transistors TN1 and TN2, cannot be activated in response to the first high potential voltage VL (when a decrease in the first high potential voltage VL is detected), the body bias of the transistors TN1 and TN2 is set to be higher than the source potential (ground level). In the illustrated example, the voltage value of the body bias Vbb, which is set by the second high potential voltage VH and the resistors R2 and R3, is set to be 0.6 V or less.

The cross-sectional structure of the N-channel MOS transistors TN1 and TN2 supplied with the body bias Vbb will now be described.

Figure 2:
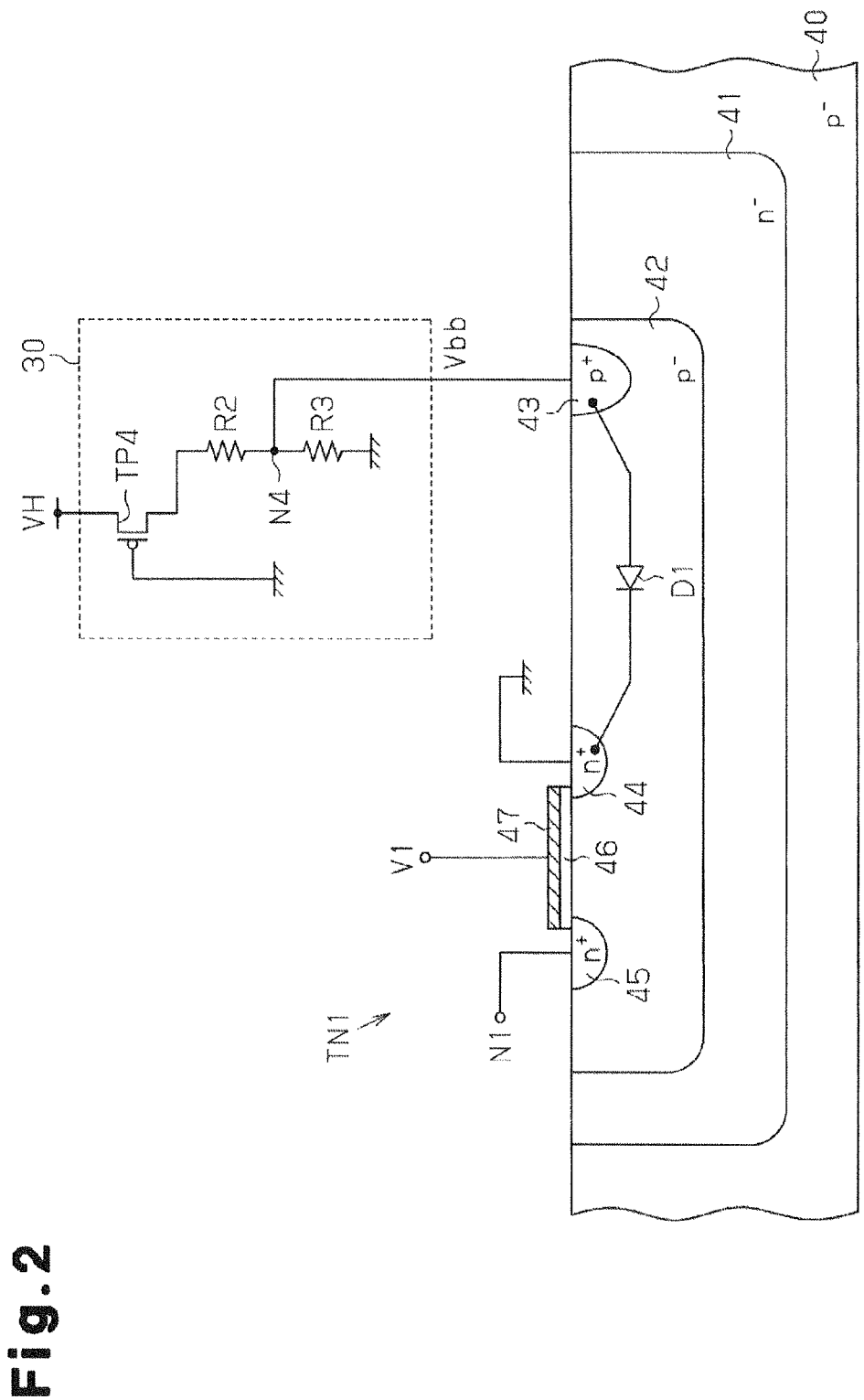
FIG. 2 is a schematic cross-sectional view of an N-channel MOS transistors according to the first embodiment.
Figure 3:
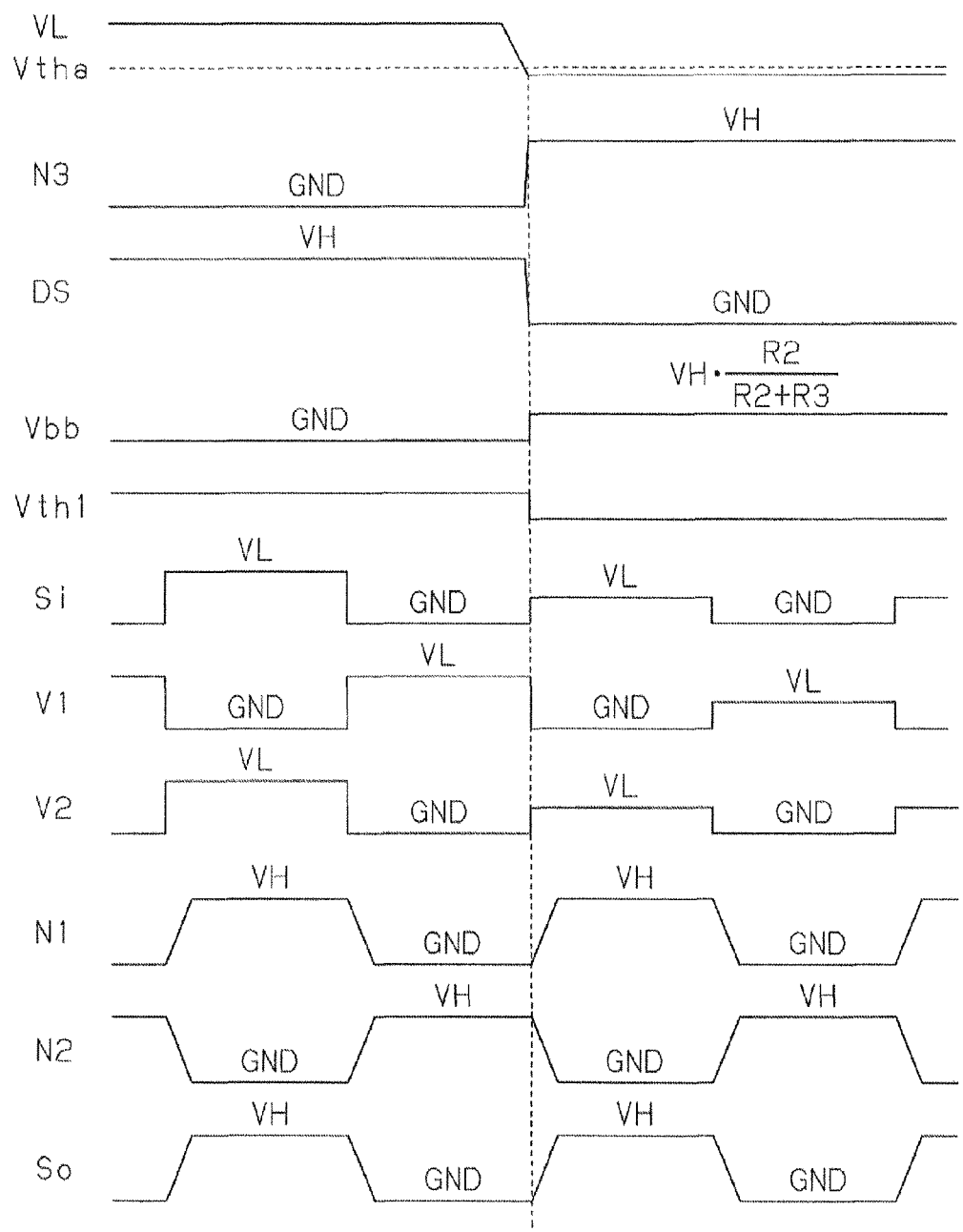
FIG. 3 is a timing chart illustrating operation of the level shift circuit according to the first embodiment.

As illustrated in FIG. 2, a p⁻ type semiconductor substrate 40 has a surface in which an n⁻ type well 41 is formed. A p⁻ type well 42 is formed in a surface of the n⁻ type well 41. A p⁺ type well 43, an n⁺ type diffusion layer 44, and an n⁺ type diffusion layer 45 are formed separately from each other in a surface of the p⁻ type well 42. Further, a gate oxide film 46 and a gate electrode 47 are formed on the surface of the p⁻ type well 42 between the n⁺ type diffusion layer 44 and the n⁺ type diffusion layer 45. The n⁺ type diffusion layer 44, n⁺ type diffusion layer 45, gate electrode 47, and p⁺ type well 43 respectively form the source, the drain, the gate, and the back gate of the N-channel MOS transistor TN1.

The n⁺ type diffusion layer 44 is coupled to ground, the n⁺ type diffusion layer 45 is coupled to node N1, and the gate electrode 47 is supplied with the output voltage V1 of the inverter circuit 11. In this configuration, the p⁺ type well 43 is supplied with the body bias Vbb from the control unit 30. As described above, the body bias Vbb is set to 0.6 V or less. Thus, a parasitic diode D1 inhibits conductance between the p⁺ type well 43 and the n⁺ type diffusion layer 44. This prevents a forward current from flowing between the p⁺ type well 43 and the n⁺ type diffusion layer 44. Thus, a problem in which such a forward current obstructing the output of the desired voltage does not occur.

The cross-sectional structure of the transistor TN2 is similar to that of the transistor TN1 and thus will not be described.

The operation of the level shift circuit 1 will now be described with reference to FIG. 3. The vertical and horizontal axes in FIG. 3 are increased or decreased in scale to facilitate illustration.

First, a case in which the first high potential voltage VL is sufficiently higher than the threshold voltage Vtha of the transistor TN3 in the detection unit 20 will be described. The threshold voltage Vtha is the same as the threshold voltage Vth of the transistors TN1 and TN2 when the transistors TN1 and TN2 have their back gates coupled to their sources (ground in the illustrated example). In this case, a gate-source voltage of the transistor TN3 becomes higher than the threshold voltage Vtha of the transistor TN3. Thus, the transistor TN3 is activated. This shifts the voltage at node N3 to the ground level. Thus, the H2 level detection signal DS is output from the inverter circuit 23. In this state, even when the body bias Vbb is at the ground level, the transistors TN1 and TN2 in the level conversion unit 10 are activated in response to the first high potential voltage VL in the same manner as the transistor TN3.

In response to the H level detection signal DS, the transistor TP4 in the control unit 30 is inactivated and the transistor TN4 is activated. Thus, node N4 shifts to the ground level. In this state, the body bias Vbb of the transistors TN1 and TN2 in the level conversion unit 10 shift to the ground level. In this manner, when the first high potential voltage VL is sufficiently higher than the threshold voltage Vth of the transistors TN1 and TN2 and the back gates are coupled to the source, the body bias Vbb of the transistors TN1 and TN2 is set to ground level.

In this state, in the level conversion unit 10, in response to the H1 level input signal Si, the L level output voltage V1 is output from the inverter circuit 11, and the H1 level output voltage V2 is output from the inverter circuit 12. In response to the L level output voltage V1, the transistor TN1 is inactivated. In response to the H1 level output voltage V2, the transistor TN2 is activated. As described above, even when the body bias Vbb is at the ground level, activation of the transistor TN2 in response to the output voltage V2 having the first high potential voltage VL level is ensured.

When the transistor TN2 is activated, the gate voltage of the transistor TP1 shifts to the ground level and activates the transistor TP1. As a result, node N1, that is, the gate voltage of the transistor TP2 shifts to the second high potential voltage VH and inactivates the transistor TP2. This shifts the voltage at node N2 to the ground level and outputs the H2 level output signal So from the inverter circuit 13.

Further, when the input signal Si shifts from the H1 level to the L level, the transistor TN1 is activated and the transistor TN2 is inactivated. As a result, the transistor TP2 is activated and the transistor TP1 is inactivated. This shifts the voltage at node N2 to the second high potential voltage VH. Thus, the L level output signal So is output from the inverter circuit 13.

Next, a case in which the first high potential voltage VL is sufficiently lower than the threshold voltage Vtha of the transistor TN3 will be described. The threshold voltage Vtha is the threshold voltage Vth of the transistors TN1 and TN2 when their back gates are coupled to their sources. In this case, the gate-source voltage of the transistor TN3 becomes lower than the threshold voltage Vtha of the transistor TN3. Thus, the transistor TN3 is inactivated. As a result, node N3 shifts to the second high potential voltage VH level due to the current I1 and a channel resistance of the transistor TN3. Thus, the L level detection signal DS is output from the inverter circuit 23. In this state, when the body bias Vbb is at the ground level, the transistors TN1 and TN2 cannot be activated in response to the first high potential voltage VL in the same manner as the transistor TN3. Alternatively, the drive capacity will be greatly lowered. In this manner, when the first high potential voltage VL decreases to such a level that the transistors TN1 and TN2 cannot be normally activated in response to the first high potential voltage VL, the detection unit 20 provides the L level detection signal DS, which indicates the decrease in voltage.

In response to this L level detection signal DS, the transistor TP4 in the control unit 30 is activated and the transistor TN4 is inactivated. Thus, the voltage at node N4, that is, the body bias Vbb of the transistors TN1 and TN2, shifts to a voltage obtained by dividing the second high potential voltage VH with the resistors R2 and R3. In this manner, when the first high potential voltage VL decreases to such a level that the transistors TN1 and TN2 cannot be normally activated in response to the first high potential voltage VL, the control unit 30 sets the body bias Vbb of the transistors TN1 and TN2 to a higher voltage than the ground level.

In this manner, when the back gates are supplied with the body bias Vbb that is higher than the source potential (ground level), that is, when the body bias Vbb is forward-biased, the substrate bias effect causes the threshold voltage Vth of the transistors TN1 and TN2 to be lower than that before they are forward-biased. Thus, even when the voltage level of the first high potential voltage VL decreases, the transistors TN1 and TN2 can be sufficiently activated in response to the first high potential voltage VL. In other words, the control unit 30 controls the body bias Vbb of the transistors TN1 and TN2 so that the threshold voltage Vth of the transistors TN1 and TN2 decrease when a decrease in the first high potential voltage VL is detected. More specifically, based on the used high potential voltages VH and VL, low potential voltage GND, and electrical characteristics of the transistors TN1 and TN2, the divided voltage value of the second high potential voltage VH is so that the threshold voltage Vth enables the transistors TN1 and TN2 to be switched for the decreased first high potential voltage VL. Further, the divided voltage of the second high potential voltage VH can be understood as being set to a body bias value that activates the transistor TN3 for the decreased first high potential voltage VL.

In this state, in the level conversion unit 10, in response to the H1 level input signal Si, the L level output voltage V1 is output from the inverter circuit 11, and the H1 level output voltage V2 is output from the inverter circuit 12. In response to the L level output voltage V1, the transistor TN1 is inactivated. In response to the H1 level output voltage V2, the transistor TN2 is activated. The threshold voltage Vth of the transistor TN2 has been lowered due to the substrate bias effect caused by the body bias Vbb set in the forward-biased state. Thus, the transistor TN2 can be sufficiently activated in response to the output voltage V2 having the decreased first high potential voltage VL to supply the current necessary to lower the potential at node N2. This quickly decreases the voltage at node N2 from the second high potential voltage VH to the ground level. Thus, the transistor TP1 is activated quickly, and the transistor TP2 is inactivated. Accordingly, the output signal So of the inverter circuit 13 is quickly inverted from the H2 level to the L level.

Further, when the input signal Si shifts from the H1 level to the L level, the transistor TN1 is activated and the transistor TN2 is inactivated. As a result, the transistor TP2 is activated and the transistor TP1 is inactivated. This causes the voltage at node N2 to shift to the second high potential voltage VH. Thus, the L level output signal So is output from the inverter circuit 13.

The first embodiment has the advantages described below.

x(1) When the detection unit 20 detects a decrease in first high potential voltage VL, the control unit 30 controls the body bias Vbb of the transistors TN1 and TN2 to decrease the threshold voltage Vth. Specifically, when the detection unit 20 detects a decrease in the level of the first high potential voltage VL, the control unit 30 sets the body bias Vbb of the transistors TN1 and TN2 to the forward-biased state. Due to the substrate bias effect caused by the body bias Vbb, the threshold voltage Vth of the transistors TN1 and TN2 decreases. Thus, the transistors TN1 and TN2 can be activated in response to the first high potential voltage VL of which voltage level has been decreased. Accordingly, even when the power supply voltage (i.e., the first high potential voltage VL) decreases, the level shift circuit 1 is prevented from failing to function.

x(2) The control unit 30 sets the body bias Vbb of the transistors TN1 and TN2 to the forward-biased state when the detection unit 20 detects a decrease in the first high potential voltage VL. That is, as long as the transistors TN1 and TN2 can be sufficiently activated in response to the signal having the level of the first high potential voltage VL, the body bias Vbb of the transistors TN1 and TN2 is set to the source potential even when a forward-bias is not applied. Thus, when the first high potential voltage VL is high, the threshold voltage Vth of the transistors TN1 and TN2 is prevented from decreasing in an unnecessary manner. This prevents leakage current from increasing when the transistors TN1 and TN2 are inactivated.

x(3) When the transistor TN3, which has the same electrical characteristics as the transistors TN1 and TN2, is inactivated in response to the first high potential voltage VL, the detection unit 20 generates the L level detection signal DS that indicates detection of decrease in the first high potential voltage VL. This allows the control unit 30 to accurately detect whether the first high potential voltage VL has decreased and become close to the threshold voltage Vth of the transistors TN1 and TN2 when a forward-bias is not applied.

A second embodiment will now be described with reference to FIGS. 4 to 9. The second embodiment differs from the first embodiment in that the level shift circuit 2 includes a plurality of level conversion units 10 and in the structure of a control unit 50. The following description will center on the differences from the first embodiment.

Figure 4:
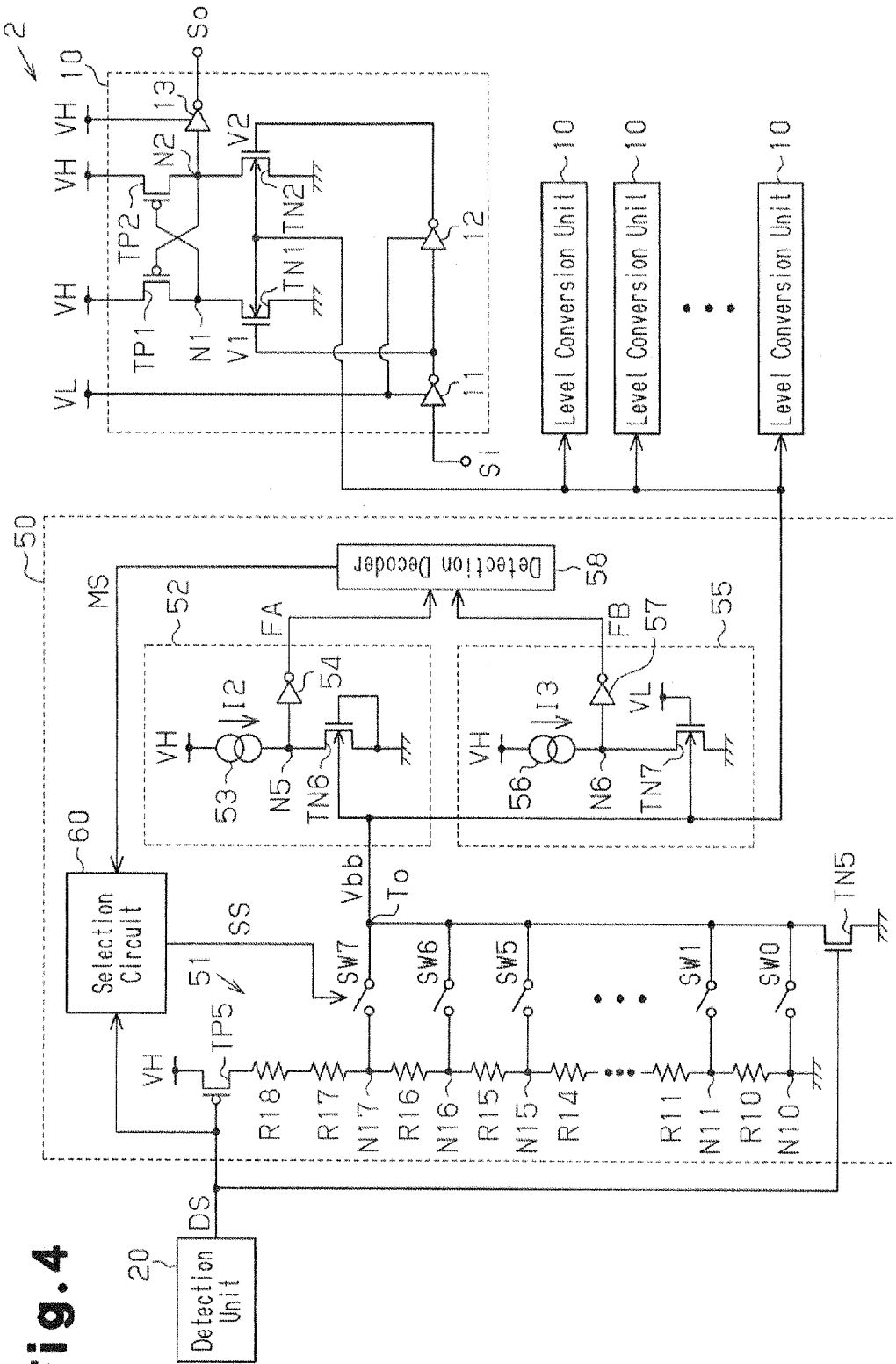
FIG. 4 is a circuit diagram of a level shift circuit according to a second embodiment.

As illustrated in FIG. 4, a voltage generation circuit 51 in the control unit 50 is activated by an L level detection signal DS output from a detection unit 20 to generate a body bias Vbb having a certain voltage value. The structure of the voltage generation circuit 51 will now be described.

The detection signal DS from the detection unit 20 is provided to the gate of a P-channel MOS transistor TP5 and the gate of an N-channel MOS transistor TN5. The source of the transistor TP5 is supplied with a second high potential voltage VH. The drain of the transistor TP5 is coupled to ground via a plurality of (nine in this case) resistors R10 to R18, which are coupled in series. The resistors R10 to R18 are coupled in series between the transistor TP5, which is supplied with the second high potential voltage VH, and ground. In the second embodiment, the eight resistors R10 to R17 are set to have the same resistance value, and the resistor R18 is set to have a resistance value higher than that of the resistors R10 to R17.

When the transistor TP5 is activated in response to the L level detection signal DS, the voltage generation circuit 51 generates a divided voltage obtained by dividing a potential difference between the second high potential voltage VH and ground with the resistors R10 to R18. For example, when the transistor TP5 is activated, at a coupling point between the resistor R10 and the ground (node N10) and other coupling points between the resistors R10 to R17 (nodes N11 to N17), divided voltages are generated by dividing the voltage between the second high potential voltage VH and ground with a corresponding certain dividing ratio.

Nodes N10 to N17 are coupled to the first terminals of switches SW0 to SW7, respectively. Second terminals of the switches SW0 to SW7 are commonly coupled to an output terminal To. The switches SW0 to SW7 are controlled so that they are activated and inactivated by a selection signal SS from a selection circuit 60. Specifically, one of the switches SW0 to SW7 is activated in response to the selection signal SS. The activated switch couples the corresponding one of nodes N10 to N17 to the output terminal To so that the potential at the output terminal To changes in accordance with the potential at the coupled one of nodes. In this manner, in response to the L level detection signal DS, the voltage generation circuit 51 provides the level conversion units 10, an upper limit detector 52, and a lower limit detector 55 with a body bias Vbb, which is a potential that appears at the output terminal To corresponding to the selection signal SS from the selection circuit 60.

The output terminal To is coupled to the drain of the N-channel MOS transistor TN5. The source of the N-channel MOS transistor TN5 is coupled to ground. The gate of the N-channel MOS transistor TN5 is provided with the detection signal DS. In response to the H2 level detection signal DS, the transistor TN5 is activated, and the output terminal To is shifted to ground level. That is, in response to the H2 level detection signal DS, the voltage generation circuit 51 supplies the body bias Vbb, which is the ground level, to the transistors TN1 and TN2 in each of the level conversion units 10.

The upper limit detector 52 is a circuit used to set an upper limit value of the body bias Vbb generated by the voltage generation circuit 51. Specifically, the upper limit detector 52 detects an upper limit value of the body bias Vbb to prevent the threshold voltage Vth of the transistors TN1 and TN2 from becoming less than 0 V when the body bias Vbb is applied. The structure of the upper limit detector 52 will now be described.

A current source 53 generates a flow of a current I2. The current source 53 has a first terminal supplied with the second high potential voltage VH and a second terminal coupled to the drain of an N-channel MOS transistor TN6. A current value of the current I2 can be set in accordance with, for example, the electrical characteristics (channel resistance) of the transistor TN6, the logical threshold value of an inverter circuit 54, and the like.

In the transistor TN6, the source and gate are coupled to ground. A back gate of the transistor TN6 is supplied with the body bias Vbb. The transistor TN6 has the same conductivity type and electrical characteristics as those of the N-channel MOS transistors TN1 and TN2 in the level conversion unit 10.

A node N5 between the current source 53 and the transistor TN6 is coupled to an input terminal of the inverter circuit 54. The inverter circuit 54 sends an upper limit detection signal FA to a detection decoder 58. For example, when the transistor TN6 is inactivated, the voltage at node N5 is shifted to the second high potential voltage VH level by the current I2 from the current source 53 and the channel resistance of the transistor TN6, and the inverter circuit 54 outputs the L level upper limit detection signal FA. When the body bias Vbb supplied to the back gate of the transistor TN6 increases and the threshold value of the transistor TN6 becomes less than 0 V, the transistor TN6 is activated even when the gate-source voltage of the transistor TN6 is 0 V. As a result, since the voltage at node N5 shifts to the ground level, the upper limit detector 52 outputs the H level upper limit detection signal FA from the inverter circuit 54.

In this manner, when the transistor TN6 has the same electrical characteristics as the transistors TN1 and TN2 and the transistor TN6, of which gate-source voltage is 0 V, is activated, the upper limit detector 52 outputs the H level upper limit detection signal FA.

The lower limit detector 55 is a circuit that sets a lower limit value of the body bias Vbb generated by the voltage generation circuit 51. Specifically, the lower limit detector 55 detects a lower limit value of the body bias Vbb with which the transistors TN1 and TN2 can be sufficiently activated in response to the first high potential voltage VL. The structure of the lower limit detector 55 will now be described.

A current source 56 generates a flow of current I3. The current source 56 includes a first terminal supplied with the second high potential voltage VH and a second terminal coupled to the drain of an N-channel MOS transistor TN7. The current I3 may be set to have a current value that is the same as or less than the current I2.

The source of the transistor TN7 is coupled to ground, and the gate of the transistor TN7 is supplied with the first high potential voltage VL. The back gate of the transistor TN7 is supplied with the body bias Vbb. The transistor TN7 has the same conductivity type and electrical characteristics as the transistors TN1 and TN2 in the level conversion unit 10.

A node N6 between the current source 56 and the transistor TN7 is coupled to an input terminal of an inverter circuit 57. The inverter circuit 57 provides the detection decoder 58 with a lower limit detection signal FB. For example, when the transistor TN7 is inactivated, the voltage at node N6 shifts to the second high potential voltage VH level due to the current I3 from the current source 56 and the channel resistance of the transistor TN7. Thus, the inverter circuit 57 outputs the L level lower limit detection signal FB. When the threshold voltage of the transistor TN7 becomes less than the first high potential voltage VL due to the application of the body bias Vbb to the back gate of the transistor TN7 (forward bias), the transistor TN7 is activated. As a result, the voltage at node N6 shifts to ground level, and the lower limit detector 55 outputs the H level lower limit detection signal FB from the inverter circuit 57.

In this manner, when the transistor TN7, which has the same electrical characteristics as the transistors TN1 and TN2 and of which the gate is supplied with the first high potential voltage VL and the back gate is supplied with the body bias Vbb, is activated, the lower limit detector 55 outputs the H level lower limit detection signal FB.

Figures 6, 7:
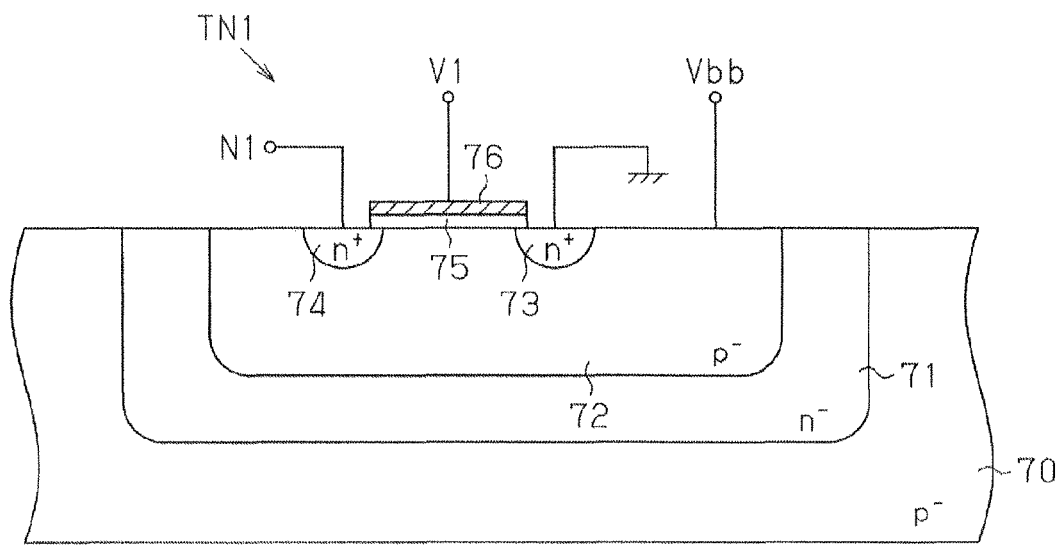
FIG. 6 is a schematic cross-sectional view of an N-channel MOS transistors according to the second embodiment.
FIG. 7 is a table illustrating the operation of the level shift circuit according to the second embodiment.

The detection decoder 58 generates a mask signal MS based on the upper limit detection signal FA and the lower limit signal FB and supplies the mask signal MS to the selection circuit 60. Specifically, the detection decoder 58 generates an H level mask signal MS when the upper limit detection signal FA is at the L level and the lower limit signal FB and is at the H level and. Otherwise, the detection decoder 58 generates an L level mask signal MS. Here, as illustrated in FIG. 7, when the L level upper limit detection signal FA and the H level lower limit detection signal FB are output, an appropriate body bias Vbb is generated in the voltage generation circuit 51 with which the transistors TN1 and TN2 can be sufficiently activated in response to the present signal having the first high potential voltage VL level. Otherwise, the body bias Vbb generated by the voltage generation circuit 51 is not appropriate in value. For example, when the H level upper limit detection signal FA is output, a body bias Vbb that lowers the threshold voltage Vth of the transistors TN1 and TN2 to less than 0 V is output from the voltage generation circuit 51. In this case, the transistors TN1 and TN2 are activated, that is, the transistors TN1 and TN2 are depleted, even when the gate-source voltage is 0 V. Thus, it becomes difficult to for the transistors TN1 and TN2 to function as logic circuits. Further, when the L level lower limit detection signal FB is output, the body bias Vbb is low. Thus, even when the body bias Vbb is supplied to the transistors TN1 and TN2, the threshold voltage Vth of the transistors TN1 and TN2 cannot be lowered to less than the first high potential voltage VL. In this case, the body bias Vbb is ineffective.

The selection circuit 60 illustrated in FIG. 4 is activated in response to the L level detection signal DS from the detection unit 20 to generate the selection signal SS that sequentially activates the switches SW0 through SW7 from the switch SW0 in the voltage generation circuit 51. Further, based on the mask signal MS from the detection decoder 58, the selection circuit 60 generates the selection signal SS to generate a body bias Vbb that is greater than or equal to a lower limit value detected by the lower limit detector 55 and lower than an upper limit value detected by the upper limit detector 52.

The upper limit detector 52 is one example of a first detector, the lower limit detector 55 is one example of a second detector, the upper limit detection signal FA is one example of a first detection signal, the lower limit detection signal FB is one example of a second detection signal, the transistor TN6 is one example of a sixth MOS transistor, and the transistor TN7 is one example of a seventh MOS transistor. Further, the selection circuit 60 is one example of a control circuit, the detection decoder 58, and the selection circuit 60 form one example of a setting circuit, the selection signal SS is one example of a control signal and a setting signal, and the control unit 50 is one example of a voltage output circuit.

Figure 5:
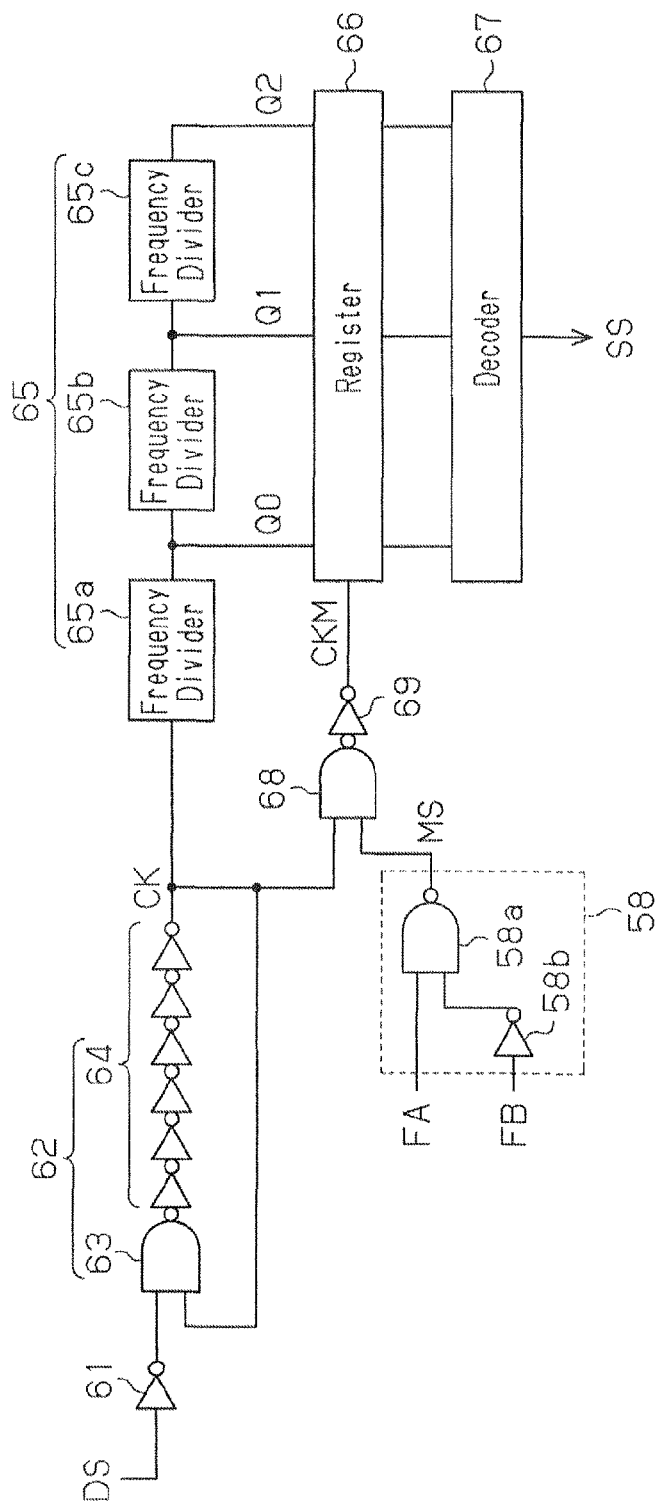
FIG. 5 is a circuit diagram of a selection circuit.

The structures of the detection decoder 58 and the selection circuit 60 will now be described with reference to FIG. 5.

The selection circuit 60 includes a ring oscillator 62, a counter 65, and a decoder 67. The detection signal DS from the detection unit 20 is provided via the inverter circuit 61 to the ring oscillator 62. The ring oscillator 62 has a NAND circuit 63 and a plurality of (six in FIG. 5) inverter circuits 64 which are coupled in a ring. The NAND circuit 63 is provided with the detection signal DS via the inverter circuit 61. An output terminal of the NAND circuit 63 is coupled to the inverter circuit 64 in the first stage. The plurality of inverter circuits 64 are coupled in series, with the inverter circuit 64 in the final state having an output terminal coupled to an input terminal of the NAND circuit 63. The ring oscillator 62 oscillates in response to the L level detection signal DS, and the inverter circuit 64 in the final state outputs a clock signal CK having a certain frequency. The clock signal CK is provided to the counter 65 and a NAND circuit 68.

The counter 65 may be a three-bit counter. The counter 65 has frequency dividers 65a to 65c, the quantity of which corresponds to the number of the bits (three in this case). The frequency divider 65a divides the frequency of the received clock signal CK by two to generate a frequency-divided signal Q0 and provided the frequency-divided signal Q0 to the frequency divider 65b. The frequency divider 65b divides the frequency-divided signal Q0 from the frequency divider 65a by two to generate a frequency-divided signal Q1 and provides the frequency-divided signal Q1 to the frequency divider 65c. The frequency-divided signal Q1 is obtained by dividing the clock signal CK by four. The frequency divider 65c divides the frequency-divided signal Q1 from the frequency divider 65b by two to generate a frequency-divided signal Q2. The frequency-divided signal Q2 is obtained by dividing the clock signal CK by eight. In this manner, the counter 65 provides a register 66 and the decoder 67 with the frequency-divided signals Q0 to Q2 generated by the frequency dividers 65a to 65c as a count signal Q[2:0].

The register 66 stores the count signal Q[2:0] received from the counter 65 based on an H level clock mask signal CKM. Specifically, based on the H level clock mask signal CKM, the register 66 stores the count signal Q[2:0] input from the counter 65. The register 66 provides the stored count signal Q[2:0] to the decoder 67.

Figures 8, 9:
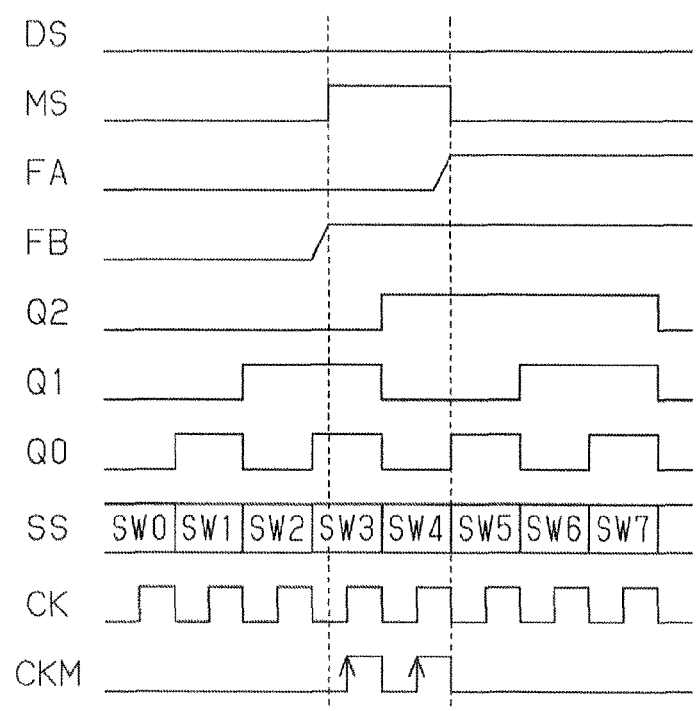
FIG. 8 is a table illustrating the operation of the level shift circuit according to the second embodiment.
FIG. 9 is a timing chart illustrating the operation of the level shift circuit according to the second embodiment.

The decoder 67 generates the selection signal SS by decoding the count signal Q[2:0] supplied from the counter 65 or the register 66 in accordance with a table illustrated in FIG. 8. For example, when the count signal Q[2:0] is "000", the decoder 67 generates the selection signal SS that activates the switch SW0. When the count signal Q[2:0] is "001", the decoder 67 generates the selection signal SS that activates the switch SW1.

A NAND circuit 58a in the detection decoder 58 is provided with the upper limit detection signal FA and, via an inverter circuit 58b, with the lower limit detection signal FB. The NAND circuit 58a provides the NAND circuit 68 in the selection circuit 60 with a mask signal MS, which is obtained through a NAND logical operation performed on the upper limit signal FA and an inverted signal of the lower limit detection signal FB.

The NAND circuit 68 provides a signal obtained by performing a NAND logical operation on the clock signal CK and the mask signal MS to an inverter circuit 69, which in turn, outputs the clock mask signal CKM. Thus, when the mask signal has an H level, the inverter circuit 69 outputs the clock signal CK as the clock mask signal CKM. When the mask signal MS has an L level, the inverter circuit 69 outputs the fixed L level clock mask signal CMK regardless of the signal level of the clock signal CK.

The ring oscillator 62 is one example of an oscillation circuit, the register 66 is one example of a memory circuit, and the decoder 67 is one example of a signal generation circuit, which generates the control signal or the setting signal.

Next, the cross-sectional structures of the transistors TN1 and TN2 supplied with the body bias Vbb in each of the level conversion units 10 will be described.

As illustrated in FIG. 6, a p⁻ type semiconductor substrate 70 includes a surface in which an n⁻ type well 71 is formed. A p⁻ type well 72 is formed in a surface of the n⁻ type well 71. The N-channel MOS transistors TN1 and TN2 in each of the plurality of level conversion units 10 are formed in the p⁻ type well 72. For example, when there are an m number of the level conversion units 10, an m number of the N-channel MOS transistors TN1 and an m number of the N-channel MOS transistors TN2 are formed in the p⁻ type well 72. FIG. 6 illustrates one of the N-channel MOS transistors TN1 formed in the p⁻ type well 72. An n⁺ type diffusion layer 73 and an n⁺ type diffusion layer 74 are formed in the p⁻ type well 72. A gate oxide film 75 and a gate electrode 76 are formed on the surface of the p⁻ type well 72 between the n⁺ type diffusion layer 73 and the n⁺ type diffusion layer 74. The n⁺ type diffusion layer 73, n⁺ type diffusion layer 74, gate electrode 76, and p⁻ type well 72 form the source, drain, gate, and back gate of the N-channel MOS transistor TN1, respectively.

The n⁺ type diffusion layer 73 is coupled to ground, the n⁺ type diffusion layer 74 is coupled to node N1, and the gate electrode 76 is supplied with the output voltage V1 of the inverter circuit 11. The p⁻ type well 72 is supplied with the body bias Vbb from the control unit 50. Accordingly, the body bias Vbb is supplied to the back gates of all of the N-channel MOS transistors TN1 and TN2 formed in the p⁻ type well 72.

The operation of the level shift circuit 2 will now be described with reference to FIG. 9. The vertical and horizontal axes in FIG. 9 are increased or decreased in scale to facilitate illustration.

In response to the L level detection signal DS output from the detection unit 20 when the first high potential voltage VL decreases, the voltage generation circuit 51 and the selection circuit 60 are activated. In response to the L level detection signal DS, the ring oscillator 62 in the selection circuit 60 starts oscillating to generate the clock signal CK. The counter 65 starts counting the clock signal CK. When the count signal Q[2:0] output from the counter 65 becomes "000", the decoder 67 decodes the count signal Q[2:0] in accordance with FIG. 8 to output the selection signal SS that activates the switch SW0. In response to the selection signal SS, the switch SW0 in the voltage generation circuit Si is activated. In this state, in the voltage generation circuit 51, the transistor TP5 is already activated in response to the L level detection signal DS, and divided voltages are generated at nodes N10 to N17. Thus, when the switch SW0 is activated, the voltage at node N10 is supplied as the body bias Vbb to the upper limit detector 52 and the lower limit detector 55. In this case, in the present example, the L level upper limit detection signal FA is output from the upper limit detector 52, and the L level lower limit detection signal FB is output from the lower limit detector 55. As a result, the L level mask signal MS is output from the detection decoder 58 (NAND circuit 58a). Thus, the L level clock mask signal CKM is output regardless of the signal level of the clock signal CK. Accordingly, the count signal Q at this point of time is not stored in the register 66.

Subsequently, when the count signal Q[2:0] becomes "001", the decoder 67 outputs the selection signal SS that activates the switch SW1. In response to the selection signal SS, the switch SW1 is activated, and the voltage at node N11 shifts to the body bias Vbb. In this manner, the switches SW0 to SW7 are sequentially activated from the switch SW0, that is, the voltages at nodes N10 to N17 are sequentially set to the body bias Vbb from the voltage at node N10 (lowest voltage). In this manner, the voltage generation circuit 51 is activated in response to the L level detection signal DS, and the body bias Vbb is generated so that the voltage value rises gradually in response to the selection signal SS.

As the selection of the switches SW0 to SW7 proceeds and the count signal Q[2:0] becomes "011", the switch SW3 is activated, and the body bias Vbb is set as the voltage at node N13. In the present example, when the body bias Vbb is applied to the back gate of the transistor TN7 in the lower limit detector 55, the transistor TN7 is activated. As a result, the lower limit detector 55 detects the voltage at node N13 as an appropriate lower limit value of the body bias Vbb and outputs the H level lower limit detection signal FB. In this case, the upper limit detector 52 continues to output the L level upper limit detection signal FA. As described above, the current value of the current I3 in the lower limit detector 55 is set to be the same as or less than that of the current I2 in the upper limit detector 52. Thus, the lower limit detector 55 outputs the H level lower limit detection signal FB.

During a period in which the L level upper limit detection signal FA and the H level lower limit detection signal FB are output, the mask signal MS is output from the detection decoder 58, and the clock mask signal CKM, which shifts to the H level in synchronization with a leading edge of the clock signal CK, is provided to the register 66. In response to the H level clock mask signal CKM, the present count signal Q[2:0] (frequency-divided signal Q2, Q1, Q0=011) is stored in the register 66.

Subsequently, when the count signal Q[2:0] becomes "100", the switch SW4 is activated, and the body bias Vbb is set as the voltage at node N14. In this state, the L level upper limit detection signal FA and the H level lower limit detection signal FB are output and the H level mask signal MS is output. Thus, the clock signal CK is provided to the register 66 as the clock mask signal CKM. That is, until the L level mask signal MS is output, the clock signal CK is provided to the register 66 as the clock mask signal CKM. Accordingly, in response to the H level clock mask signal CKM, the present count signal Q[2:0] (frequency-divided signals Q2, Q1, Q0=100) is re-written to the register 66.

Then, when the count signal Q[2:0] becomes "101", the switch SW5 is activated to set the body bias Vbb as the voltage at node N15. In the present example, when the current body bias Vbb is applied to the back gate of the transistor TN6 in the upper limit detector 52, the transistor TN6 is activated. As a result, when the body bias Vbb is applied to the transistors TN1 and TN2, the upper limit detector 52 detects that the transistors TN1 and TN2 are depleted and outputs the H level upper limit detection signal FA. As a result, the mask signal MS output from the detection decoder 58 shifts to the L level, and the clock mask signal CKM is fixed to the L level. Thus, the present count signal Q [2:0] (frequency-divided signals Q2, Q1, Q0=101) is not stored in the register 66. Accordingly, the count signal Q[2:1] (frequency-divided signals Q2, Q1, Q0=100) generated in the previous selection operation remains stored in the register 66. It can be understood that the H level upper limit detection signal FA is a signal indicating detection that the voltage at node N14 generated in the previous selection operation is an appropriate upper limit value of the body bias Vbb.

The switches SW6 and SW7 are selected subsequently. However, the upper limit detection signal FA obviously remains at the H level. Thus, the clock mask signal CKM remains fixed to the L level, and the contents stored in the register 66 remain unchanged. Accordingly, the selection of the switches SW0 to SW7 may be stopped, for example, when the mask signal MS falls to the L level.

The above selection operations (setting operations) can set the body bias Vbb to an appropriate value between an upper limit value and a lower limit value and store the setting in the register 66.

When such selection operations end, the count signal Q[2:0] stored in this register 66 is output to the decoder 67, which in turn outputs the selection signal SS that activates the switch SW4. This prevents the transistors TN1 and TN2 from being depleted, and supplies the transistors TN1 and TN2 with a body bias Vbb, which is capable of switching the transistors TN1 and TN2 in response to the signal having the first high potential voltage VL level. Accordingly, even when the first high potential voltage VL decreases, the level conversion unit 10 is prevented from failing to operate. Whenever the first high potential voltage VL changes, the selection operations (setting operations) may be repeated.

In addition to advantages (1) to (3) of the first embodiment, the second embodiment has the advantages described below.

x(4) The control unit 50, which includes the detection decoder 58 and the selection circuit 60, gradually increases a voltage value of the body bias Vbb, detects a lower limit value and an upper limit value of the body bias Vbb, and sets the body bias Vbb to a voltage value between the lower limit value and the upper limit value. As a result, the voltage value of the body bias Vbb is automatically set so that the threshold Vth voltage of the transistors TN1 and TN2 is greater than 0 V, and the threshold Vth voltage of the transistors TN1 and TN2 enables activation in response to a signal having the first high potential voltage VL.

x(5) The control unit 50 repeats the operations for setting the body bias Vbb whenever the first high potential voltage VL varies. This automatically sets the appropriate body bias Vbb that corresponds to the present first high potential voltage VL.

A third embodiment will now be described with reference to FIGS. 10 to 12. Like or same reference numerals are given to those components that are the same as the corresponding components of the embodiment illustrated in FIGS. 1 to 9.

Figure 17:
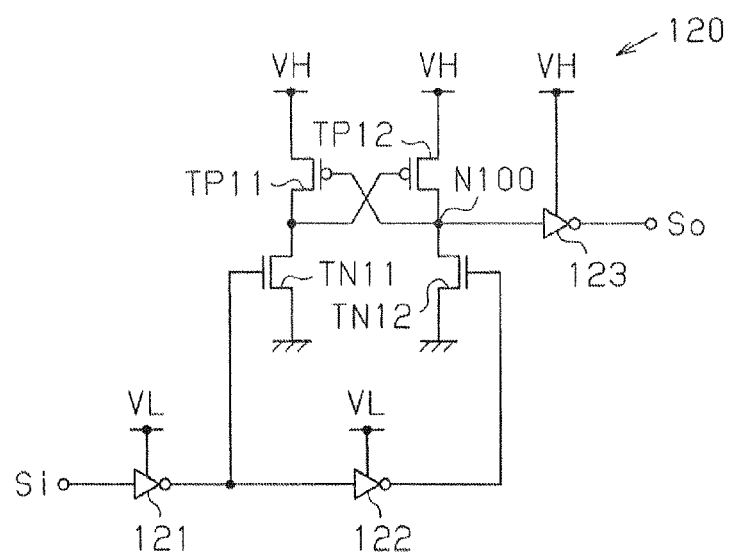
FIG. 17 is a circuit diagram of a conventional level shift circuit.

In a level shift circuit 120 illustrated in FIG. 17, when the voltage at a node N100 between transistors TN12 and TP12 changes from a second high potential voltage VH level to a ground level, the output of an inverter circuit 123 would not be inverted. This problem is likely to occur when an input signal Si is switched to an H1 level from a state in which a transistor TP11 is activated in response to the L level input signal Si, a transistor TN11 is activated, a transistor TN12 is inactivated, a transistor TP12 is activated, and a transistor TP11 is inactivated. Specifically, when the input signal Si shifts from the L level to the H1 level, the gate voltage of the transistor TP12 is still at the L level. Thus, the transistor TP12 is in activated, and the voltage at node N100 is at the second high potential voltage VH level. Under this situation, to invert the output of the inverter circuit 123, the voltage at node N100 is required to be decreased to approximately one fifth of the second high potential voltage VH. However, when the first high potential voltage VL is lowered, and the first high potential voltage VL becomes close to the threshold voltage of the transistor TN12, the transistor TN12 cannot be sufficiently activated, and sufficient current for lowering the voltage at node N100 cannot be obtained. Thus, the voltage at node N100 cannot be lowered to the desired voltage value. This results in a problem in which the output of the inverter circuit 123 cannot be inverted.

The inventor has studied this problem and found that the threshold voltage Vth of the transistors TN1 and TN2 can be calculated as described below so that the threshold voltage Vth of the transistors TN1 and TN2 enables switching with respect to a signal having the first high potential voltage VL. In detail, when the transistor TN2 of a level conversion unit 10a illustrated in FIG. 10 can be sufficiently activated in response to an input signal Si having the H1 level, the transistors TP2 and TN2 substantially operate in a saturation region immediately after the input signal Si shifts from the L level to the H1 level. In this case, the drain current Id1 of the transistor TP2 is equal to the drain current Id2 of the transistor TN2. Thus, the following equation is satisfied.

$$Id1 = Id2 \frac{1}{2}\mu 1 \times Cox \frac{W1}{L1}(|Vgs1| - |Vth1|)^2 \quad (1)$$
$$= \frac{1}{2}\mu 2 \times Cox \frac{W2}{L2}(Vgs2 - Vth)^2$$

In equation (1), μ1 represents the mobility of the transistor TP2, L1 represents the channel length of the transistor TP2, W1 represents the channel width of the transistor TP2, μ2 represents the mobility of the transistor TN2, L2 represents the channel length of the transistor TN2, and W2 represents the channel width of the transistor TN2. Vgs1 represents the gate-source voltage of the transistor TP2, Vgs2 represents the gate-source voltage of the transistor TN2, Vth1 represents the threshold voltage of the transistor TP2, and Cox represents the gate capacitance per unit area of a MOS transistor.

The equation (1) can also be rewritten as indicated below.

$$\frac{W1}{W2} = \frac{L1}{L2} \times \frac{\mu 2}{\mu 1} \times \frac{(Vgs2 - Vth)^2}{(|Vgs1| - |Vth1|)^2} \quad (2)$$

The gate-source voltage Vgs1 of the transistor TP2 under the worst condition is equal to the second high potential voltage VH (Vgs1=VH) because the present gate voltage of the transistor TP2 is 0 V. The relation between the second high potential voltage VH and the threshold voltage Vth1 satisfies the expression indicated below.

$$VH >> |Vth1| \quad (3)$$

Thus, the second high potential voltage VH can be approximated as indicated below.

$$|Vgs1| - |Vth1| \approx VH \quad (4)$$

The gate-source voltage Vgs2 of the transistor TN2 becomes equal to the first high potential voltage VL (Vgs2=VL). Thus, equation (1) can be rewritten as indicated below.

$$\frac{W1}{W2} = \frac{L1}{L2} \times \frac{\mu 2}{\mu 1} \times \frac{(VL - Vth)^2}{VH^2} \quad (5)$$

By rearranging equation (5), the threshold voltage Vth of the transistor TN2 can be expressed as indicated below.

$$Vth = VL\left(1 - \frac{VH}{VL}\sqrt{\frac{\mu 1 \times Cox \frac{W1}{L1}}{\mu 2 \times Cox \frac{W2}{L2}}}\right) \quad (6)$$

Equation (7), which is indicated below, may be substituted into equation (6).

$$\beta x = \mu x \times Cox \frac{Wx}{Lx} \quad (7)$$

In this case, equation (6) can be simplified as indicated below.

$$Vth = VL\left(1 - \frac{VH}{VL}\sqrt{\frac{\beta 1}{\beta 2}}\right) \quad (8)$$

Based on equation (8), the threshold voltage Vth of the transistor TN2 can be obtained. Further, equation (1) is satisfied when the transistor TN2 operates in a substantially saturated region in response to a signal having the first high potential voltage VL level. Thus, the threshold voltage Vth of the transistor TN2 can be obtained using equation (8) to enable the transistor TN2 to be switched in response to the signal having the first high potential voltage VL level. That is, the threshold voltage Vth of the transistor TN2 that enables switched in response to a signal having the first high potential voltage VL level can be obtained using equation (8). The threshold voltage Vth of the transistor TN2 has been described above. However, the threshold voltage Vth of the transistor TN1 can also be obtained using equation (8).

Values β1 and β2 in equation (8) can be obtained beforehand based on process conditions of the transistors TN1, TN2, TP1, TP2, and the like. Accordingly, as long as values of the first high potential voltage VL and a ratio between the first high potential voltage VL and the second high potential voltage VH (VH/VL) can be obtained, the threshold voltage of the transistors TN1 and TN2 can be obtained. Further, by setting the voltage value of the body bias Vbb at the threshold voltage Vth of the transistors TN1 and TN2, activation of the transistors TN1 and TN2 is ensured in response to a signal having the first high potential voltage VL. From this new point of view, the third embodiment employs the structure described below.

Figure 10:
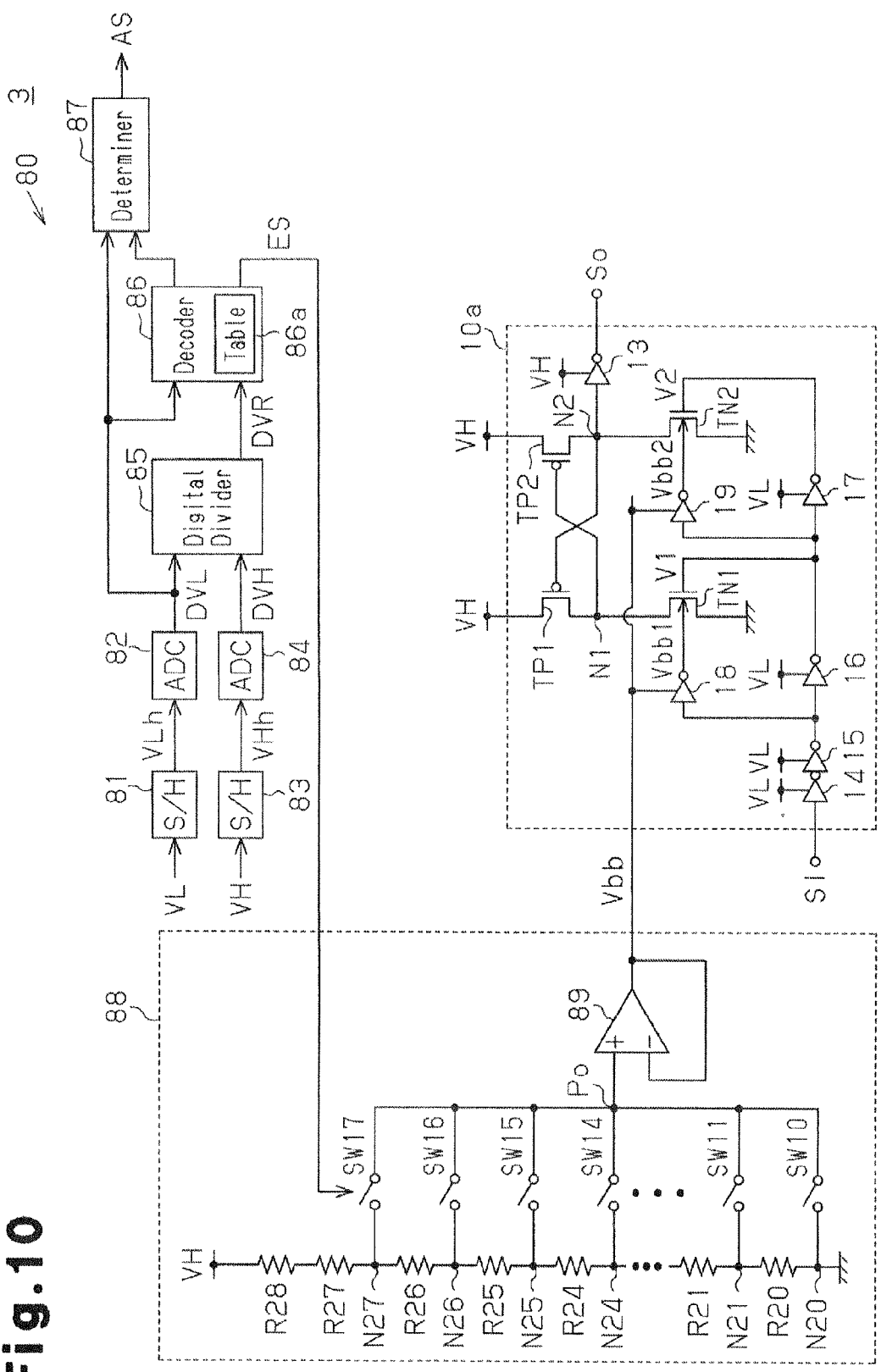
FIG. 10 is a circuit diagram of a level shift circuit according to a third embodiment.

As illustrated in FIG. 10, a level shift circuit 3 includes a level conversion unit 10a and a control unit 80 that controls the body bias Vbb based on the first and second high potential voltages VL and VH when a decrease in the level of the first high potential voltage VL is detected.

In the level conversion unit 10a, the input signal Si is provided as an output voltage V1 to the gate of the transistor TN1 via inverter circuits 14, 15, and 16. Further, the output voltage V1 of the inverter circuit 16 is supplied as an output voltage V2 to the gate of the transistor TN2 via an inverter circuit 17. The inverter circuits 14 to 17 are supplied with the first high potential voltage VL as an operation voltage.

An output voltage VT (signal having the same level as the input signal Si) of the inverter circuit 15 is supplied to an inverter circuit 18. An output terminal of the inverter circuit 18 is coupled to the back gate of the transistor TN1. The inverter circuit 18 is supplied with a body bias Vbb, which is generated by the control unit 80 and serves as an operation voltage. Thus, when the output voltage VT of the inverter circuit 15 has the H1 level, that is, when the transistor TN1 is inactivated, the inverter circuit 18 applies a body bias Vbb1 having the L level (ground level) to the back gate of the transistor TN1. When the output voltage VT of the inverter circuit 15 is at the L level, that is, when the transistor TN1 is activated, the inverter circuit 18 applies a body bias Vbb1 having the H level (body bias Vbb level) to the back gate of the transistor TN1.

The output voltage V1 of the inverter circuit 16 is supplied to an inverter circuit 19. An output terminal of the inverter circuit 19 is coupled to the back gate of the transistor TN2. The inverter circuit 19 is supplied with the body bias Vbb, which is generated by the control unit 80 and serves as an operation voltage. Thus, in the same manner as the inverter circuit 18, the inverter circuit 19 applies an L level body bias Vbb2 to the transistor TN2 when the transistor TN2 is inactivated. Further, the inverter circuit 19 applies the H level body bias Vbb2 to the transistor TN2 when the transistor TN2 is in activated.

The structure of the control unit 80 will now be described.

A sample-and-hold circuit (S/H circuit) 81 is supplied with the first high potential voltage VL. The S/H circuit 81 samples and holds the first high potential voltage VL at a certain timing and supplies the held voltage VLh to an analog-to-digital converter (ADC) 82.

The ADC 82 converts the held voltage VLh, which is an analog signal, into a digital value (digital signal) and provides the digital value as a first high potential voltage value DVL to a digital divider (divider) 85, a decoder 86, and a determiner 87. That is, the ADC 82 generates the first high potential voltage value DVL obtained by converting a voltage value of the first high potential voltage VL into a digital value.

An S/H circuit 83 is supplied with the second high potential voltage VH. The S/H circuit 83 samples and holds the second high potential voltage VH at a certain timing and supplies the held voltage VHh to an ADC 84. The S/H circuits 81 and 83 eliminate temporal changes in the level of the first high potential voltage VL and the second high potential voltage VH.

The ADC 84 converts the held voltage VHh, which is an analog signal, into a digital value and provides the digital value as a second high potential voltage value DVH to the divider 85. That is, the ADC 84 generates the second high potential voltage value DVH obtained by converting the voltage value of the second high potential voltage VH into a digital value.

The divider 85 divides the second high potential voltage value DVH by the first high potential voltage value DVL and provides the calculated value DVR (=DVH/DVL) to the decoder 86. That is, the divider 85 generates a calculated value DVR that corresponds to the ratio (VH/VL) between the first high potential voltage VL and the second high potential voltage value DVH.

The decoder 86 includes a conversion table 86a, which associates the input signal and the output signal in advance. The decoder 86 converts the first high potential voltage value DVL input from the ADC 82 and the calculated value DVR input from the divider 85 into a setting signal ES that sets a voltage value of the body bias Vbb in accordance with the conversion table 86a.

In detail, in the conversion table 86a, as illustrated in FIG. 11, the first high potential voltage DVL and the calculated value DVR are associated with the body bias Vbb applied to the transistors TN1 and TN2. The voltage value of the body bias Vbb is set in advance in accordance with a threshold voltage Vth of the transistors TN1 and TN2 that is calculated based on equation (8) using the corresponding first high potential voltage value DVL (voltage value of the first high potential voltage VL) and the calculated value DVR (value of VH/VL). The calculation of the threshold voltage Vth of the transistors TN1 and TN2 based on equation (8) uses values β1 and β2, which are calculated in advance using the process conditions of the transistors TN1, TN2, TP1, and TP2. Further, in the conversion table 86a, the voltage value of the body bias Vbb is associated with the setting signal ES that activates one of the switches SW10 to SW17 in a voltage generation circuit 88. In the third embodiment, when the setting signal ES is "000", "001", "010", ..., and "111", the switches SW10, SW11, SW12, ..., and SW17 in the voltage generation circuit 88 are activated, respectively.

The decoder 86 having the conversion table 86a converts the first high potential voltage value DVL and the calculated value DVR into a voltage value of the body bias Vbb. Further, the decoder 86 converts the body bias Vbb voltage value into a setting signal ES. Then, the setting signal ES is provided to the determiner 87 and the voltage generation circuit 88 as illustrated in FIG. 10.

When the transistors TN1 and TN2 cannot be activated in response to the first high potential voltage VL having a lowered voltage level, the decoder 86 generates the setting signal ES that sets the body bias Vbb in the forward-biased state. In other words, the decoder 86 controls the voltage value of the body bias Vbb when a decrease is detected in the first high potential voltage VL.

Based on the first high potential voltage DVL and the setting signal ES, the determiner 87 outputs an alarm signal AS when the voltage value of the body bias Vbb is higher than that of the first high potential voltage VL (Vbb>VL). For example, as illustrated in FIG. 11, when the first high potential voltage DVL is "000" and the calculated value DVR is "010", the setting signal ES becomes "100". In this state, the voltage value (0.4 V) of the body bias Vbb is higher than the voltage value (0.2 V) of the first high potential voltage VL. Thus, the determiner 87 outputs the alarm signal AS. In such a case, operation is destabilized in the inverter circuits 18 and 19, which are supplied with the body bias Vbb as the operation voltage and of which the input terminals are supplied with the first high potential voltage VL. To cope with this problem, the determiner 87 outputs the alarm signal AS that warns, for example, a user to stop using the present first high potential voltage VL. In other words, the alarm signal AS functions as a signal indicating that the present first high potential voltage VL is less than a lower limit value of the first high potential voltage VL (upper limit value of the body bias Vbb) that enables operation of the level shift circuit 3.

As illustrated in FIG. 10, the voltage generation circuit 88 includes a plurality of (nine in this case) resistors R20 to R28, which are coupled in series between the terminal supplied with the second high potential voltage VH and ground. In the third embodiment, the eight resistors R20 to R27 are set to have the same resistance value and the resistor R28 is set to have a higher resistance value than the other resistors R20 to R27.

The voltage generation circuit 88 generates divided voltages by dividing a potential difference between the second high potential voltage VH and the ground with the nine resistors R20 to R28. For example, a coupling point between the resistor R20 and the ground and coupling points between the resistors R20 to R27, namely, nodes N20 to N27 are each supplied with a divided voltage generated by dividing a voltage between the second high potential voltage VH and ground with a certain dividing ratio. In the third embodiment, the voltages at nodes N20 to N27 are set to 0 V, 0.1 V, 0.2 V, 0.3 V, 0.4 V, 0.5 V, 0.6 V, and 0.7 V, respectively.

The nodes N20 to N27 are respectively coupled to first terminals of the switches SW10 to SW17, respectively. Second terminals of the switches SW20 to SW27 are commonly coupled to an output terminal Po. The activation and inactivation of the switches SW20 to SW27 are controlled by the setting signal ES from the decoder 86. For example, one of the switches SW20 to SW27 is activated in accordance with the selection signal SS. This couples one of nodes N20 to N27 to the output terminal Po via the activated switch. That is, the potential at the output terminal Po changes in accordance with the potential at the coupled one of nodes N20 to N27. The potential at node N20 coupled to the switch SW10 is the ground level, and the switch SW10 is activated when forward biasing is unnecessary.

Further, the output terminal Po is coupled to a high-potential side power supply terminal of each of the inverter circuits 18 and 19 via a voltage follower-coupled operational amplifier 89. In this manner, the voltage generation circuit 88 supplies the inverter circuits 18 and 19 with the body bias voltage Vbb, which serves as the operation voltage and has the potential at the output terminal Po corresponding to the setting signal ES, that is, the voltage value converted by the decoder 86.

The digital divider 85 is one example of a divider, the decoder 86 is one example of a signal generation circuit that generates the setting signal, the inverter circuit 18 is one example of a first switch, and the inverter circuit 19 is one example of a second switch.

The operation of the level shift circuit 3 will now be described with reference to FIGS. 11 and 12. The following will describe the operation of the level shift circuit 3 when the first high potential voltage VL is lower than the threshold voltage Vth of the transistors TN1 and TN2 in a state in which forward bias is not applied. The vertical and horizontal axes in FIG. 12 are increased or decreased in scale to facilitate illustration.

Here, the first high potential voltage VL is 0.5 V, the second high potential voltage VH is 2 V, and a value obtained by dividing the second high potential voltage VH by the first high potential voltage VL (VH/VL) is 4. In this case, as illustrated in FIG. 11, the first high potential voltage value DVL output from the ADC 82 becomes "011", and the calculated value DVR output from the divider 85 becomes "110". As a result, the decoder 86 converts the first high potential voltage value DVL of "011" and the calculated value DVR of "110" into a voltage value of the body bias Vbb (0.4 V) and further converts the voltage value of 0.4 V into a setting signal ES of "100". Then, the determiner 87 compares the first high potential voltage value DVL of "011 and the setting signal ES value of "100". In this case, the voltage value (0.4 V) of the body bias Vbb is less than the voltage value (0.5 V) of the first high potential voltage VL. Thus, the determiner 87 does not output the alarm signal AS.

When the setting signal ES value of "100" is provided from the decoder 86 to the voltage generation circuit 88, the switch SW14 is activated. This supplies the voltage (=0.4 V) at node N24, which is coupled to the switch SW14, to as the operation voltage of the inverter circuits 18 and 19.

Figure 12:
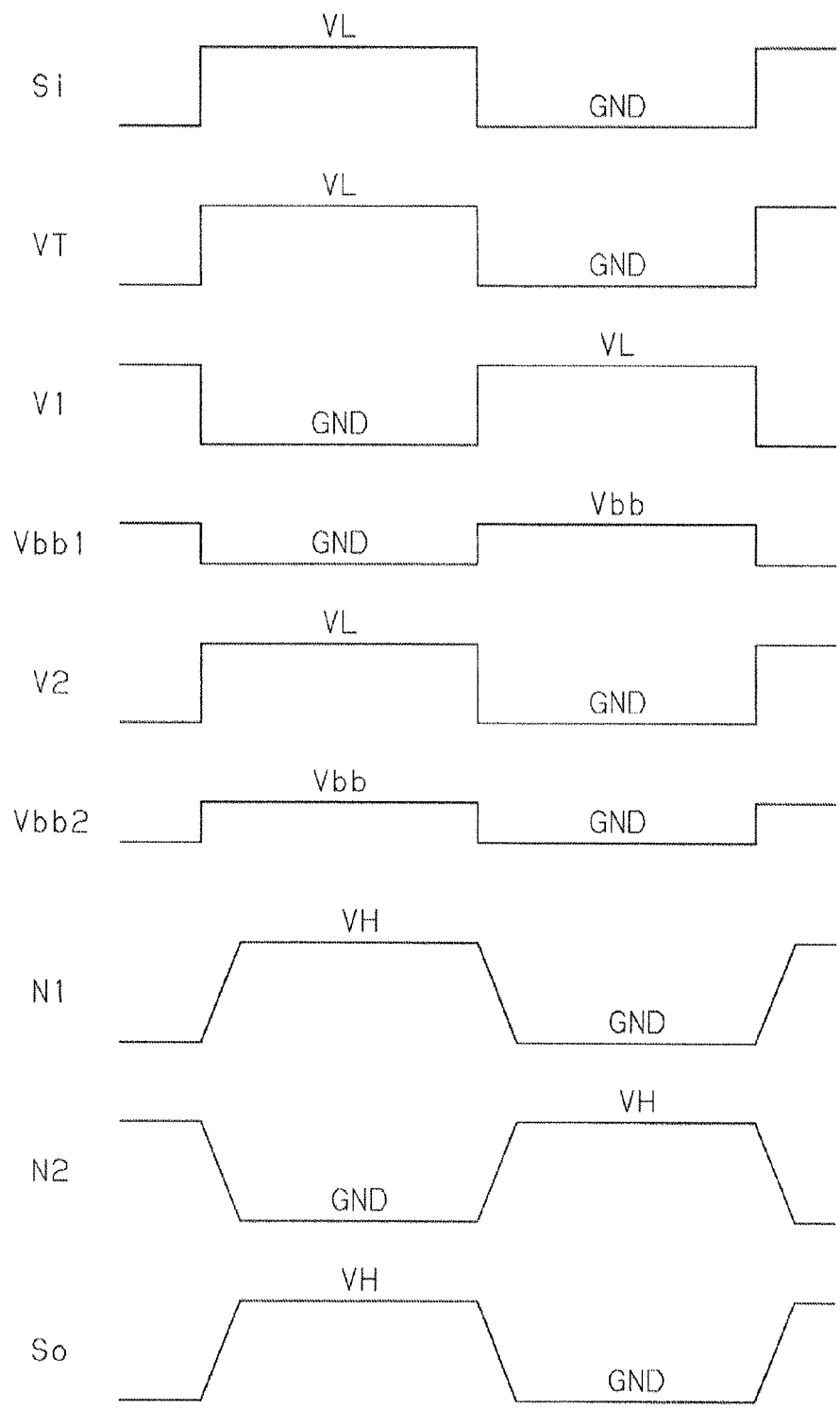
FIG. 12 is a timing chart illustrating operation of the level shift circuit according to the third embodiment.

In this case, as illustrated in FIG. 12, when the input signal Si shifts from the L level to the H1 level, the output voltage VT of the inverter circuit 15 shifts to the H1 level, the output voltage V1 of the inverter circuit 16 shifts to the L level, and the output voltage V2 of the inverter circuit 17 shifts to the H1 level. As a result, the L level body bias Vbb1 is provided from the inverter circuit 18 to the back gate of the transistor TN1 in response to the output voltage V1. Further, the transistor TN1 is inactivated in response to the output voltage VT That is, when the transistor TN1 is inactivated, the inverter circuit 18 controls and lowers the body bias Vbb1 to increase the threshold voltage Vth of the transistor TN1

In response to the output voltage V1, the body bias Vbb2 having the H level (voltage (=0.4 V) at node N24) is provided from the inverter circuit 19 to the back gate of the transistor TN2. Due to application of the body bias Vbb2 (forward biasing), the threshold voltage Vth of the transistor TN2 is lowered to a threshold voltage calculated from equation (8). Thus, even when the first high potential voltage VL is lowered, the transistor TN2 is sufficiently activated in response to the output voltage V2 having the first high potential voltage VL. This readily lowers the voltage at node N2 from the second high potential voltage VH level to the ground level. Thus, the transistor TP1 is activated, and the transistor TP2 is inactivated. Then, the H2 level output signal So is output from the inverter circuit 13. As described above, when the transistor TN2 is activated, the inverter circuit 19 controls the body bias Vbb2 to decrease the threshold voltage Vth of the transistor TN2.

When the input signal Si shifts from the H1 level to the L level, the body bias Vbb1 is controlled by the inverter circuit 18 to decrease the threshold voltage Vth of the transistor TN1, which switches to an activated state. Further, the body bias Vbb is controlled by the inverter circuit 19 to increase the threshold voltage Vth of the transistor TN2, which switches to an inactivated state.

In addition to advantages (1) and (2) of the first embodiment, the third embodiment has the advantages described below.

x(6) The body bias Vbb is controlled in accordance with the first high potential voltage VL and the value of the ratio between the first high potential voltage VL and the second high potential voltage VH. For example, the voltage value of the body bias Vbb is set to be the threshold voltage Vth of the transistors TN1 and TN2 calculated by equation (8) based on the first high potential voltage VL and the value of the ratio between the first high potential voltage VL and the second high potential voltage VH. This allows accurate setting of the voltage value of the body bias Vbb so that the threshold voltage Vth of the transistors TN1 and TN2 enables activation response to a signal having the first high potential voltage VL level.

x(7) Further, by controlling the body bias Vbb in this manner, unnecessary layouts can be avoided by controlling the threshold voltage Vth of the transistors TN1 and TN2. In detail, for example, to control the threshold voltage Vth of the transistors TN1 and TN2 by setting the element size of the transistor TN2, the ratio of W2/L2 of the transistor TN2 must be larger than the ratio of W1/L1 of the transistor TP2. For example, when roughly estimating an element size ratio between the transistors TP2 and TN2 based on the relationship between the first high potential voltage VL and the second high potential voltage VH, equation (5) can be approximated as indicated below.

$$\frac{\frac{W1}{L1}}{\frac{W2}{L2}} \approx \frac{\mu 2}{\mu 1} \times \frac{1}{2 \times \left(\frac{VH}{VL}\right)^2} \quad (9)$$

Further, the equation indicated below may be used.

$$\frac{\mu 2}{\mu 1} = \frac{2}{1} \quad (10)$$

As a result, the expression indicated below is obtained from equation (9).

$$\frac{\frac{W1}{L1}}{\frac{W2}{L2}} \approx \frac{1}{\left(\frac{VH}{VL}\right)^2} \quad (11)$$

Here, for example, the first high potential voltage VL is 0.8 V and the second high potential voltage VH is 3.6 V. In this case, the following equation is obtained.

$$\left(\frac{VH}{VL}\right)^2 = 20.25 \quad (12)$$

In this case, when L1=L2 is satisfied, W2=20.25 is satisfied in relation with W1=1. That is, it is necessary to for the ratio of W2/L2 of the N-channel MOS transistor TN2 to be much larger than the ratio of W1/L1 of the P-channel MOS transistor TP2. When laying out transistors TP2 and TN2 having such element size, the irregular shape enlarges the occupied area.

However, the control unit 80 of the third embodiment controls the threshold voltage Vth of the transistor TN2 by controlling the voltage value of the body bias Vbb. Thus, irregular shapes are avoided when laying out the transistors TN1 and TN2. Thus, when described in a somewhat overemphasized manner, even when the transistors TP2 and TN2 have the same element size, by controlling the body bias Vbb, the threshold voltage Vth of the transistor TN2 can be set to a value that allows for activation in response to a signal of the first high potential voltage VL level. Accordingly, unnecessary layouts are effectively prevented.

x(8) Further, a new setting signal ES is generated whenever the first high potential voltage VL changes. Thus, an appropriate body bias Vbb is automatically set in accordance with the present first high potential voltage VL.

x(9) When the voltage value of the applied body bias Vbb is higher than the voltage value of the first high potential voltage VL (Vbb>VL), the alarm signal AS is output indicating that the current first high potential voltage VL is less than the lower limit value (appropriate value) of the first high potential voltage VL at which the level shift circuit 3 can operate. This prevents the level shift circuit 3 from failing to operate.

It should be apparent to those skilled in the art that the present invention may be embodied in many other specific forms without departing from the spirit or scope of the invention. Particularly, it should be understood that the present invention may be embodied in the following forms.

Figures 13, 14:
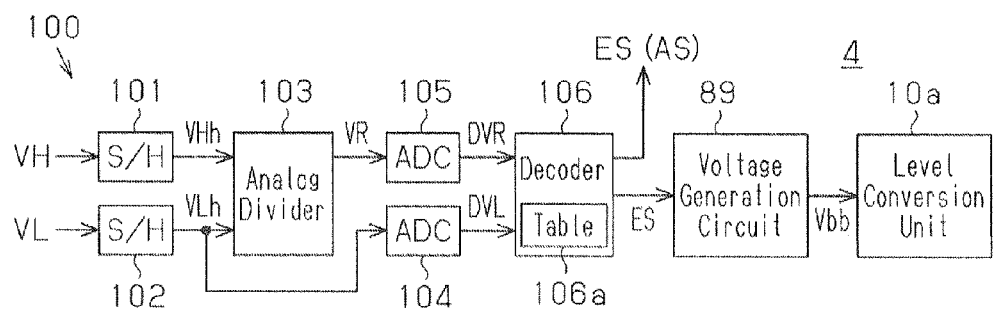
FIG. 13 is a block diagram illustrating a modified example of a level shift circuit.
FIG. 14 is modified example of a conversion table.
Figure 15:
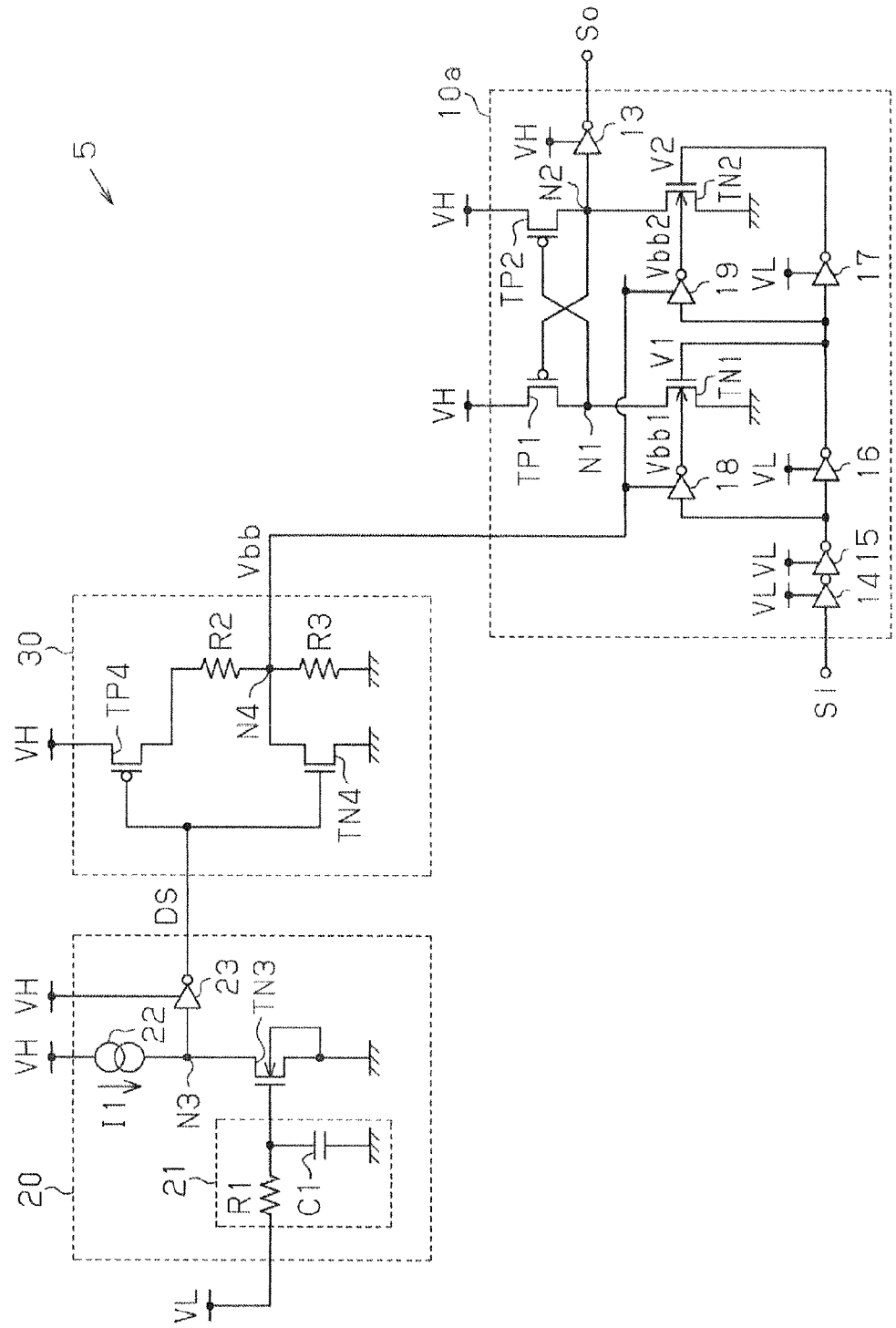
FIG. 15 is a circuit diagram of a modified example of a level shift circuit.

The structure of the control unit 80 in the third embodiment may be changed. For example, in the third embodiment, after the voltage values of the first high potential voltage VL and the second high potential voltage VH are converted into digital values, the converted second high potential voltage DVH is divided by the converted first high potential voltage DVL. However, the present invention is not limited in such a manner. For example, FIG. 13 illustrates a modified example of a level shift circuit 4 in which a control unit 100 includes an analog divider 103 that divides a voltage value VHh (analog value) of the second high potential voltage VH, which is held in an S/H circuit 101, by a voltage value VLh (analog value) of the first high potential voltage VL, which is held in an S/H circuit 102. In this case, the control unit 100 includes an ADC 104, which converts the held voltage VHh output from the S/H circuit 102 into a first high potential voltage value DVL (digital value), and an ADC 105, which converts a calculated value VR output from the divider 103 into a calculated value (digital value).

Further, in the third embodiment, the determiner 87 determines whether a voltage value of the body bias Vbb is higher than that of the first high potential voltage VL and then outputs the alarm signal AS. The present invention is not limited in such a manner. For example, as illustrated in FIG. 13, when the voltage value of the body bias Vbb is higher than the voltage value of the first high potential voltage VL, the setting signal ES corresponding to the alarm signal AS may be output from a decoder 106. In this case, for example, in a conversion table 106a of the decoder 106, for a case in which the voltage value of the body bias Vbb is higher than that of the first high potential voltage VL, the input signal is associated with a value corresponding to the alarm signal AS (refer to "NG" in FIG. 14) as illustrated in FIG. 14. Further, in the conversion table 106a, the value corresponding to the alarm signal AS is associated with the setting signal ES having a specific value ("111" in FIG. 14). Thus, when the setting signal having "111" is output from the decoder 106, the user, for example, is warned to stop using the current first high potential voltage VL in the same manner as when the alarm signal AS is output.

The decoder 86 in the third embodiment first converts the first high potential voltage value DVL and the calculated value DVR into a voltage value of the applied body bias Vbb and then converts the voltage value of the body bias Vbb into the setting signal ES. The present invention is not limited in this manner. For example, in the decoder 86 (conversion table 86a), the first high potential voltage value DVL and the calculated value DVR may be directly converted into the setting signal ES.

The S/H circuits 81 and 83 may be eliminated from the level shift circuit 3 of the third embodiment.

In the third embodiment, as long as a signal corresponding to the setting signal ES is provided to the voltage generation circuit 88 from an external device, the S/H circuits 81 and 83, the ADCs 82 and 84, the divider 85, the decoder 86, and the determiner 87 may be eliminated from the level shift circuit 3.

The register 66 in the second embodiment is not particularly limited as long as it is a memory circuit that stores the count signal Q[2:0] from the counter 65. For example, the register 66 may be replaced by a latch circuit.

The selection circuit 60 in the second embodiment controls the voltage generation circuit 51 so that the voltage value of the body bias Vbb gradually increases. However, for example, the voltage generation circuit 51 may be controlled so that the voltage value of the body bias Vbb gradually decreases.

In the second embodiment, instead of coupling the gate of the transistor TN6 in the upper limit detector 52 to ground, a certain bias voltage may be supplied to the gate of the transistor TN6.

In the second embodiment, the gate of the transistor TN7 in the lower limit detector 55 may be supplied with a certain bias voltage in place of the first high potential voltage VL.

In the first and second embodiments, as long as a signal corresponding to the detection signal DS is provided to the control units 30 and 50 from an external device, the detection unit 20 may be eliminated from the level shift circuits 1 and 2.

In the embodiments, the second high potential voltage VH supplied to the detection unit 20 and the control units 30, 50, and 80 may be generated with a band gap reference voltage. This supplies the detection unit 20 and the control units 30, 50, and 80 with a voltage having small temperature variations. Thus, the desired body bias Vbb may be accurately generated.

The level conversion units 10 and 10a in the embodiments output the output signal So via the inverter circuit 13 from node N2 between the transistors TN2 and TP2. Instead, the output signal So may be output from node N1 between the transistors TN1 and TP1.

The embodiments may be combined. For example, FIG. 5 illustrates a level shift circuit 5 in which the level conversion unit 10 of the first embodiment is replaced by the level shift circuit 10a of the third embodiment. Further, in the first and third embodiments, the body bias Vbb generated in the control units 30 and 80 may be supplied to the plurality of level conversion units 10 and 10a. Alternatively, the voltage generation circuit 88 of the third embodiment may be replaced by the detection unit 20 and voltage generation circuit 51 of the second embodiment.

Figure 16:
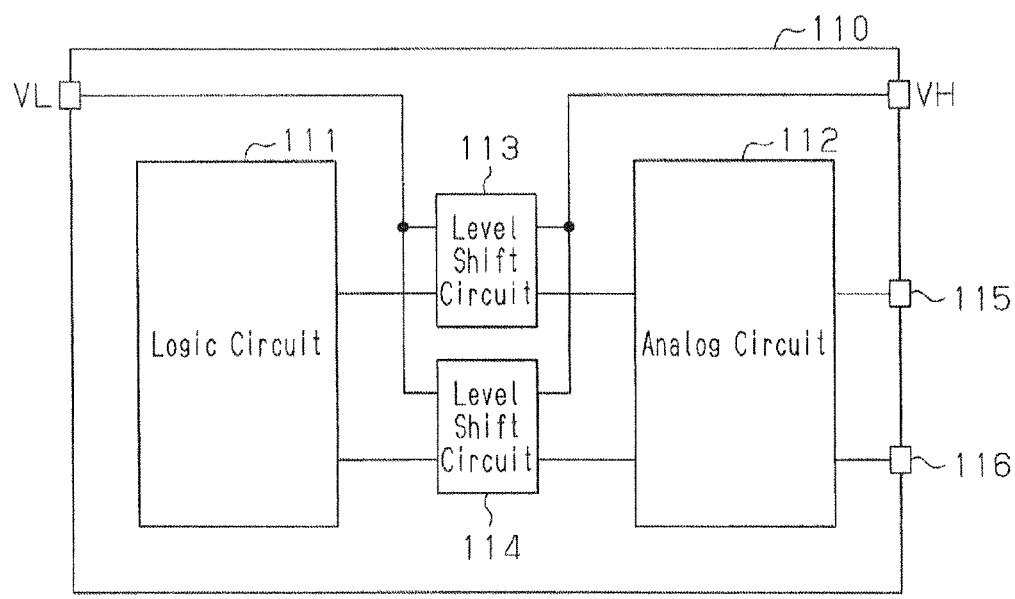
FIG. 16 is a block diagram of an LSI including the level shift circuit.

The level shift circuits in the embodiments may be applied to a semiconductor device. FIG. 16 illustrates one example of a semiconductor integrated circuit (LSI) 110. The LSI 110 includes a first circuit, or logic circuit 111 (power supply domain), that operates on the first high potential voltage VL and a second circuit, or analog circuit 112 (power supply domain), that operates on the second high potential voltage VH.

The logic circuit 111 handles, for example, image data or moving image data that forms digital signals and includes an analog-to-digital converter that converts an analog signal into a digital signal. Further, the analog circuit 112 handles, for example, voice data that forms analog signals and includes a digital-to-analog converter that converts a digital signal into an analog signal. The logic circuit 111 is not particularly limited as long as it operates on the first high potential voltage VL. Further, the analog circuit 112 is not limited in particular as long as it operates on the second high potential voltage VH.

The logic circuit 111 is coupled to a level shift circuit 113 and a level shift circuit 114. The level shift circuit 113 converts a signal of the first high potential voltage VL level output from the logic circuit 111 into a signal having the second high potential voltage VH level and provides the converted signal to the analog circuit 112. The level shift circuit 113 may be any one of, for example, the level shift circuits 1 to 5 in the embodiments.

The level shift circuit 114 converts a signal having the second high potential voltage VH level output from the analog circuit 112 into a signal having the first high potential voltage VL level and provides the converted signal to the logic circuit 111.

The analog circuit 112 is coupled to an input terminal 115, which receives the input signal that is input to the analog circuit 112 from outside the LSI 110, and an output terminal 116, which outputs an output signal that is output from the analog circuit 112 out of the LSI 110.

Further, the level shift circuits 1 to 5 in the above embodiments may be used, for example, as an interface circuit for an external circuit.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A level shift circuit comprising:
a level conversion unit that converts an input signal having a signal level of a first voltage into a signal having a signal level of a second voltage that is higher than the first voltage, wherein the level conversion unit includes first and second MOS transistors of a first conductivity type and third and fourth MOS transistors of a second conductivity type, which differs from the first conductivity type and of which switching is controlled in accordance with the input signal, the third and fourth MOS transistors include drains supplied with the second voltage via the first and second MOS transistors, respectively; and
a control unit coupled to a back gate of each of the third and fourth MOS transistors of the level conversion unit to apply a body bias to the back gates of the third and fourth MOS transistors, wherein the control unit, when receiving a detection signal indicating a decrease in the first voltage, controls a voltage value of the body bias applied to the third and fourth MOS transistors to decrease a threshold voltage of the third and fourth MOS transistors.

2. The level shift circuit according to claim 1, further comprising a detection unit that includes a fifth MOS transistor of the second conductivity type, wherein the fifth MOS transistor has a threshold voltage that is greater than or equal to threshold voltage of the third and fourth MOS transistors when the back gates of the third and fourth MOS transistors are coupled to sources in the third and fourth MOS transistors, and the fifth MOS transistor generates the detection signal when the fifth MOS transistor is inactivated in response to the first voltage,
wherein the control unit controls the voltage value of the body bias in accordance with the detection signal from the detection unit.

3. The level shift circuit according to claim 2, wherein
the first conductivity type is a P type,
the second conductivity type is an N type, and
the control unit controls the voltage value of the body bias in accordance with the detection signal so that the threshold voltage of the third and fourth MOS transistors is greater than 0 V and enables switching of the third and fourth MOS transistor in response to the input signal.

4. The level shift circuit according to claim 3, wherein the control unit includes:
a voltage generation circuit that generates the body bias in accordance with the detection signal;
a first detector that detects if the threshold voltage of the third and fourth MOS transistors is less than 0 V and generates a first detection signal;
a second detector that detects switching of the third and fourth MOS transistors in response to the input signal and generates a second detection signal; and
a setting circuit coupled to the first and second detectors, wherein the setting circuit sets a voltage value of the body bias in accordance with the first and second detection signals, the setting circuit includes a control circuit coupled to the voltage generation circuit, and the control circuit controls the voltage generation circuit to gradually change a voltage value of the body bias in accordance with the detection signal.

5. The level shift circuit according to claim 1, wherein the control unit changes a voltage value of the body bias in accordance with a variation in the first voltage.

6. The level shift circuit according to claim 4, wherein:
the first detector has electrical characteristics that are the same as the third and fourth MOS transistors and includes a sixth MOS transistor of the second conductivity type, the sixth MOS transistor includes a gate and a source that are coupled to each other, and the first detector generates the first detection signal when the sixth MOS transistor is activated by application of the body bias to a back gate of the sixth MOS transistor; and
the second detector has electrical characteristics that are the same as the third and fourth MOS transistors and includes a seventh MOS transistor of the second conductivity type, the seventh MOS transistor includes a back gate to which the body bias is applied, and the second detector generates the second detection signal when the seventh MOS transistor is activated in response to the first voltage.

7. The level shift circuit according to claim 4, wherein the control unit includes:
an oscillation circuit that generates a clock signal having a constant frequency in response to the detection signal;
a counter coupled to the oscillation circuit to count the clock signal; and
a signal generation circuit that generates a control signal that controls the voltage generation circuit to gradually increase the voltage value of the body bias based on a count value of the counter.

8. The level shift circuit according to claim 7, wherein
the setting circuit includes a memory circuit that stores the count value of the counter at a timing based on the first detection signal and the second detection signal, and
the signal generation circuit generates the control signal based on the count value stored in the memory circuit.

9. The level shift circuit according to claim 1, wherein the control unit controls the body bias in accordance with a voltage value of the first voltage and a value obtained by dividing a voltage value of the second voltage by the voltage value of the first voltage.

10. The level shift circuit according to claim 9, wherein the control unit includes:
a divider that generates a calculated value by dividing the voltage value of the second voltage by the voltage value of the first voltage;
a setting signal generation circuit that includes a conversion table associating in advance the voltage value of the first voltage and the calculated value of the divider with a certain body bias voltage value, and the setting signal generation circuit generates a setting signal that sets the voltage value of the body bias in accordance with the conversion table; and
a voltage generation circuit that generates the body bias having a voltage value corresponding to the setting signal provided from the setting signal generation circuit.

11. The level shift circuit according to claim 10, wherein the control unit outputs an alarm signal indicating that the first voltage is not appropriate when the voltage value of the certain body bias is greater than the voltage value of the first voltage.

12. The level shift circuit according to claim 9, wherein:
each of the first and second MOS transistors includes a drain and a gate, the drain of the first MOS transistor is coupled to the gate of the second MOS transistor, the gate of the first MOS transistor is coupled to the drain of the second MOS transistor, and the drains of the first and second MOS transistors are respectively coupled to the drains of the third and fourth MOS transistors; and
the control unit generates the body bias in accordance with the threshold voltage of the third and fourth MOS transistors calculated by an equation of $$Vth = VL\left(1 - \frac{VH}{VL}\sqrt{\frac{\mu 1 \times Cox \frac{W1}{L1}}{\mu 2 \times Cox \frac{W2}{L2}}}\right)$$

where VL represents the voltage value of the first voltage, VH represents the voltage value the second voltage, µ1 represents mobility of the first and second MOS transistors, L1 represents a channel length of the first and second MOS transistors, W1 represents a channel width of the first and second MOS transistors, µ2 represents mobility of the third and fourth MOS transistors, L2 represents a channel length of the third and fourth MOS transistors, W2 represents a channel width of the third and fourth MOS transistors, and Cox represents gate capacitance per unit area of a MOS transistor.

13. The level shift circuit according to claim 1, further comprising:
a first switch that controls the body bias of the third MOS transistor so that the threshold voltage of the third MOS transistor decreases when the third MOS transistor is activated and increases when the third MOS transistor is inactivated; and
a second switch that controls the body bias of the fourth MOS transistor so that the threshold voltage of the fourth MOS transistor decreases when the fourth MOS transistor is activated and increases when the fourth MOS transistor is inactivated.

14. A level shift circuit comprising:
a conversion circuit that includes a transistor, which receives an input signal, and converts an amplitude of the input signal and;
a detection circuit that includes a replica transistor which is a replicate of the transistor and detects whether the replica transistor becomes activated or inactivated in response to a voltage level of the input signal and outputs a detection signal; and
a voltage output circuit coupled to the conversion circuit and the detection circuit, wherein the voltage output circuit applies body bias to a back gate of the transistor so that the replica transistor becomes activated in response to the detection signal from the detection circuit indicating that the replica transistor is inactivated.

15. The level shift circuit according to claim 14, wherein in response to a voltage level of the input signal applied to a gate of the transistor, the conversion circuit converts the amplitude of the input signal when a power supply voltage that is greater than the voltage level is applied between a source and drain of the transistor.

16. A semiconductor device comprising:
a first circuit that operates on a first voltage;
a second circuit that operates on a second voltage, which is greater than the first voltage; and
a level shift circuit coupled to the first and second circuit to convert an input signal having a signal level of the first voltage received from the first circuit into a signal having a signal level of the second voltage to provide the converted signal to the second circuit, wherein the level shift circuit includes a level conversion unit, and the level conversion unit includes first and second MOS transistors of a first conductivity type and third and fourth MOS transistors of a second conductivity type, which differs from the first conductivity type and of which switching is controlled in a complementary manner in accordance with the input signal, the third and fourth MOS transistors include drains supplied with the second voltage via the first and second MOS transistors, respectively; and
a control unit coupled to the level conversion unit, wherein the control unit, when receiving a detection signal indicating a decrease in the first voltage, controls a voltage value of a body bias applied to a back gate of the third and fourth MOS transistors to decrease a threshold voltage of the third and fourth MOS transistors.

* * * * *